(12) United States Patent
Song et al.

(10) Patent No.: US 11,380,791 B2
(45) Date of Patent: Jul. 5, 2022

(54) SEMICONDUCTOR DEVICE

(71) Applicant: Samsung Electronics Co., Ltd., Suwon-si (KR)

(72) Inventors: Hyun-Seung Song, Hwaseong-si (KR); Hyo-Jin Kim, Seoul (KR); Kyoung-Mi Park, Yongin-si (KR); Hwi-Chan Jun, Yongin-si (KR); Seung-Seok Ha, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 68 days.

(21) Appl. No.: 16/225,122

(22) Filed: Dec. 19, 2018

(65) Prior Publication Data
US 2019/0378926 A1 Dec. 12, 2019

(30) Foreign Application Priority Data
Jun. 7, 2018 (KR) .................. 10-2018-0065260

(51) Int. Cl.
| H01L 29/78 | (2006.01) |
| H01L 29/08 | (2006.01) |
| H01L 29/66 | (2006.01) |
| H01L 29/423 | (2006.01) |
| H01L 29/417 | (2006.01) |

(52) U.S. Cl.
CPC ...... *H01L 29/7827* (2013.01); *H01L 29/0847* (2013.01); *H01L 29/41741* (2013.01); *H01L 29/41775* (2013.01); *H01L 29/42356* (2013.01); *H01L 29/66553* (2013.01); *H01L 29/66666* (2013.01)

(58) Field of Classification Search
CPC .......... H01L 29/0676; H01L 29/41741; H01L 29/41775; H01L 29/4236; H01L 29/7827
See application file for complete search history.

(56) References Cited

U.S. PATENT DOCUMENTS

| 8,373,235 B2 | 2/2013 | Masuoka et al. |
| 8,937,359 B2 | 1/2015 | Xie et al. |
| 9,312,383 B1* | 4/2016 | Cheng ............... H01L 21/84 |
| 9,478,631 B2 | 10/2016 | Lin et al. |
| 9,640,529 B2 | 5/2017 | Song et al. |
| 9,685,340 B2 | 6/2017 | Ok et al. |
| 9,824,921 B1 | 11/2017 | Labonte et al. |

(Continued)

*Primary Examiner* — Jesse Y Miyoshi
(74) *Attorney, Agent, or Firm* — Sughrue Mion, PLLC

(57) ABSTRACT

A semiconductor device includes a first impurity region, a channel pattern, a second impurity region, a gate structure, a first contact pattern, a second contact pattern and a spacer. The first impurity region may be formed on a substrate. The channel pattern may protrude from an upper surface of the substrate. The second impurity region may be formed on the channel pattern. The gate structure may be formed on a sidewall of the channel pattern and the substrate adjacent to the channel pattern, and the gate structure may include a gate insulation pattern and a gate electrode. The first contact pattern may contact an upper surface of the second impurity region. The second contact pattern may contact a surface of the gate electrode. The spacer may be formed between the first and second contact patterns. The spacer may surround a portion of a sidewall of the second contact pattern, and the spacer may contact a sidewall of each of the first and second contact patterns.

13 Claims, 37 Drawing Sheets

(56) References Cited

U.S. PATENT DOCUMENTS

| | | | |
|---|---|---|---|
| 9,876,015 B1 | 1/2018 | Balakrishnan et al. | |
| 10,062,752 B1* | 8/2018 | Leobandung | H01L 29/41741 |
| 2010/0213539 A1* | 8/2010 | Masuoka | H01L 29/78642 |
| | | | 257/329 |
| 2010/0219483 A1* | 9/2010 | Masuoka | H01L 27/1104 |
| | | | 257/369 |
| 2011/0303985 A1* | 12/2011 | Masuoka | H01L 29/78642 |
| | | | 257/369 |
| 2014/0070326 A1* | 3/2014 | Masuoka | H01L 21/76895 |
| | | | 257/368 |
| 2016/0126336 A1 | 5/2016 | Wu et al. | |
| 2017/0352625 A1* | 12/2017 | Leobandung | H01L 27/1203 |
| 2018/0005904 A1* | 1/2018 | Lee | H01L 29/7827 |
| 2018/0012798 A1 | 1/2018 | Labonte et al. | |
| 2018/0012839 A1 | 1/2018 | Zang et al. | |
| 2018/0012887 A1 | 1/2018 | Labonte et al. | |
| 2018/0026135 A1 | 1/2018 | Balakrishnan et al. | |
| 2018/0248034 A1* | 8/2018 | Leobandung | H01L 29/4238 |

* cited by examiner

SEMICONDUCTOR DEVICE

CROSS-REFERENCE TO RELATED APPLICATION

This application claims priority under 35 USC § 119 to Korean Patent Application No. 10-2018-0065260, filed on Jun. 7, 2018 in the Korean Intellectual Property Office (KIPO), the contents of which are herein incorporated by reference in their entirety.

BACKGROUND

1. Field

Example embodiments relate to a semiconductor device. More particularly, example embodiments relate to semiconductor devices including a vertical field effect transistor (vFET).

2. Description of the Related Art

Recently, a highly integrated semiconductor device including the vFET may be needed. The vFET may include a channel pattern, upper and lower impurity regions disposed over and under the channel pattern and a gate electrode surrounding the channel pattern. Also, contact patterns may be formed on the upper and lower impurity regions and the gate electrode, respectively.

SUMMARY

Example embodiments provide a highly integrated semiconductor device including a vFET.

According to example embodiments, there is provided a semiconductor device. The semiconductor may include: a first impurity region on a substrate; a channel pattern protruding from an upper surface of the substrate; a second impurity region on the channel pattern; a gate structure on a sidewall of the channel pattern and the substrate adjacent to the channel pattern, the gate structure including a gate insulating pattern and a gate electrode; a first contact pattern contacting an upper surface of the second impurity region; a second contact pattern contacting a surface of the gate electrode; and a spacer between the first and second contact patterns, wherein the spacer surrounds a portion of a sidewall of the second contact pattern, and the spacer contacts a sidewall of each of the first and second contact patterns.

According to example embodiments, there is provided a semiconductor device. The semiconductor device may include: a first impurity region on a substrate, a plurality of channel patterns protruding from an upper surface of the substrate, each of the channel patterns extending in a first direction and being arranged in a second direction perpendicular to the first direction; second impurity regions on each of the plurality of channel patterns; a gate structure on sidewalls of the channel patterns and the substrate between the channel patterns, the gate structure including a gate insulation pattern and a gate electrode; a first contact pattern contacting upper surfaces of the second impurity regions; a second contact pattern contacting a surface of the gate electrode; and a spacer between the first and second contact patterns, wherein the spacer surrounds a portion of a sidewall of the second contact pattern, and the first and second contact patterns are electrically isolated by the spacer.

According to example embodiments, there is provided a semiconductor device. The semiconductor may include: a first impurity region on a substrate; a plurality of channel patterns protruding from an upper surface of the substrate; second impurity regions on each of the plurality of channel patterns; a gate structure on a sidewall of the channel pattern and the substrate between the channel patterns, the gate structure including a gate insulation pattern and a gate electrode; a first contact pattern contacting entire upper surfaces of the second impurity regions, the first contact pattern covering upper surfaces of the second impurity regions and a portion between the second impurity regions; a second contact pattern contacting a surface of the gate electrode; and a spacer surrounding a portion of a sidewall of the second contact pattern, wherein the spacer covers a sidewall of the first contact pattern and a sidewall of the second impurity region.

In the semiconductor device in accordance with example embodiments, the first contact pattern and the second contact pattern may be disposed adjacent to each other with spacer therebetween. Thus, a horizontal area of the substrate for forming the first and second contact patterns may decrease.

DESCRIPTION OF EMBODIMENTS

Example embodiments will be more clearly understood from the following detailed description taken in conjunction with the accompanying drawings. In the specification, a direction substantially perpendicular to an upper surface of a substrate may be defined as a vertical direction, and a direction substantially parallel to the upper surface of the substrate may be defined as a horizontal direction. Two directions of the horizontal direction crossing each other may be defined as first and second directions, respectively. In example embodiments, the first and second directions may be substantially perpendicular to each other.

Figure 1:
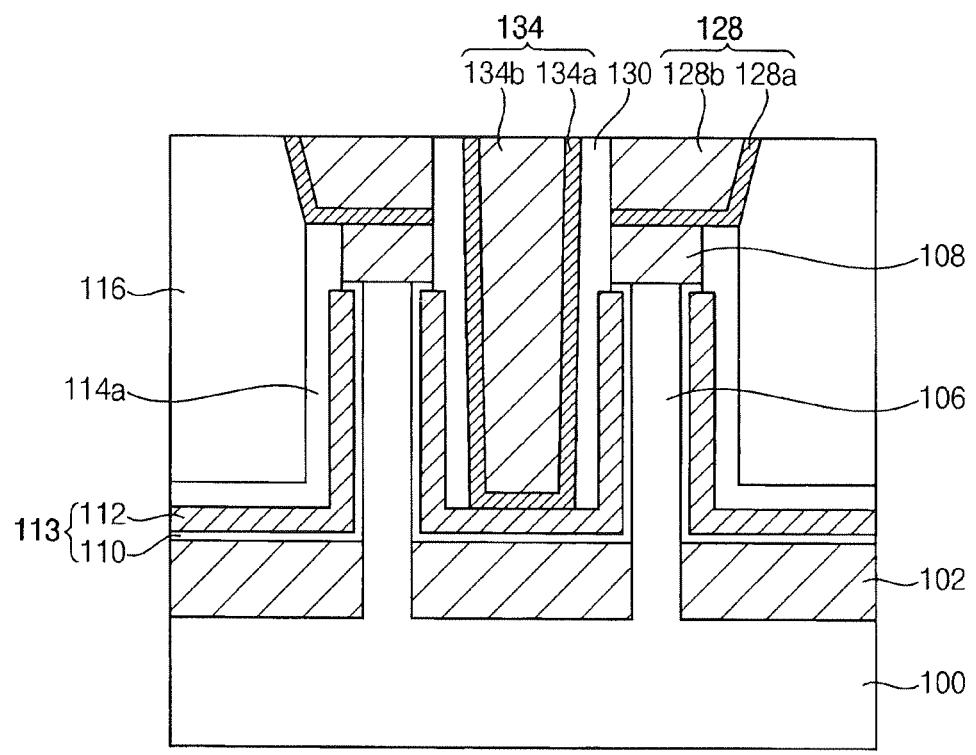
FIGS. 1, 2 and 3 are a cross-sectional view, a perspective view and a plan view illustrating a semiconductor device in accordance with example embodiments, respectively.
Figure 2:
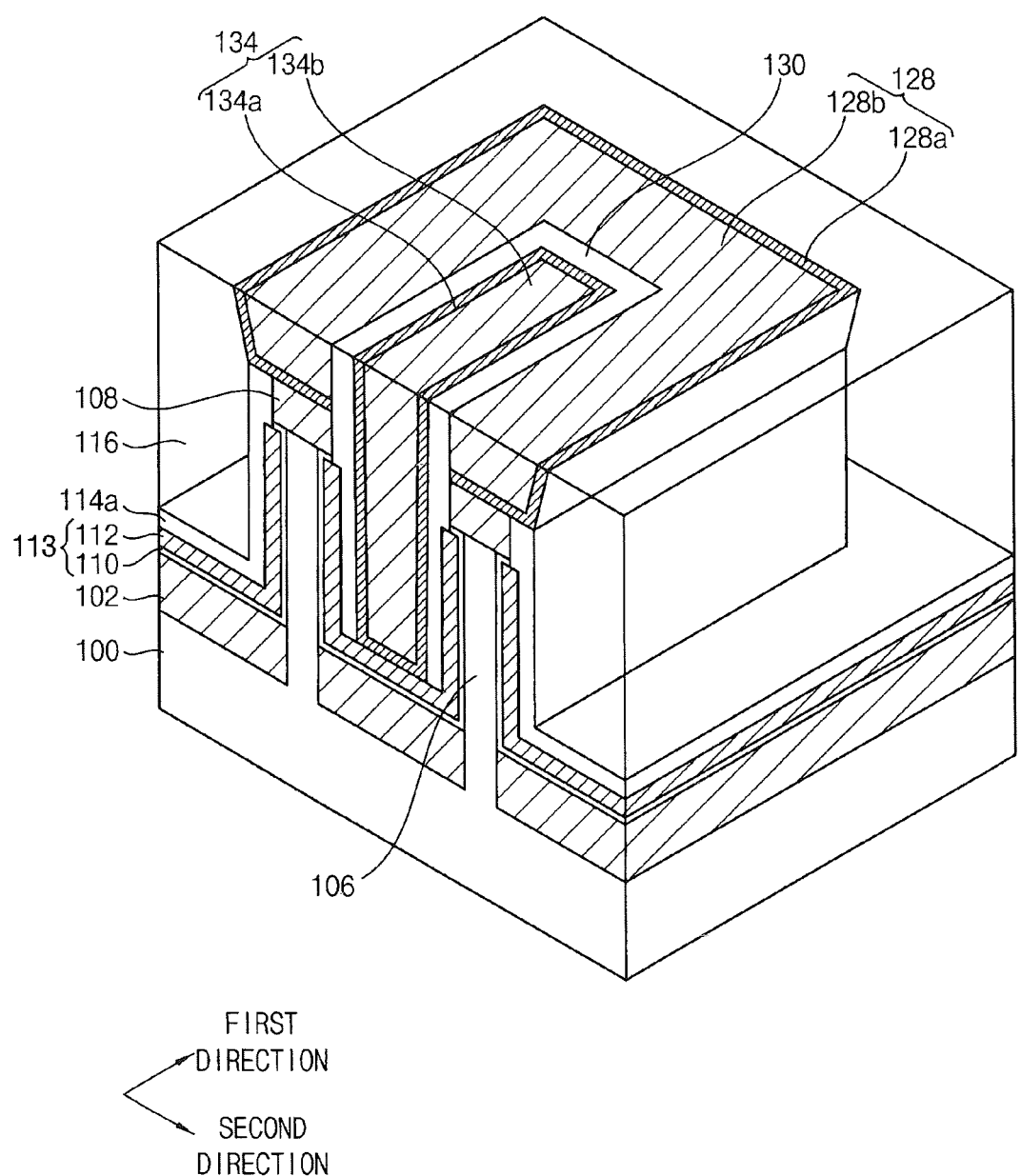
Figure 3:
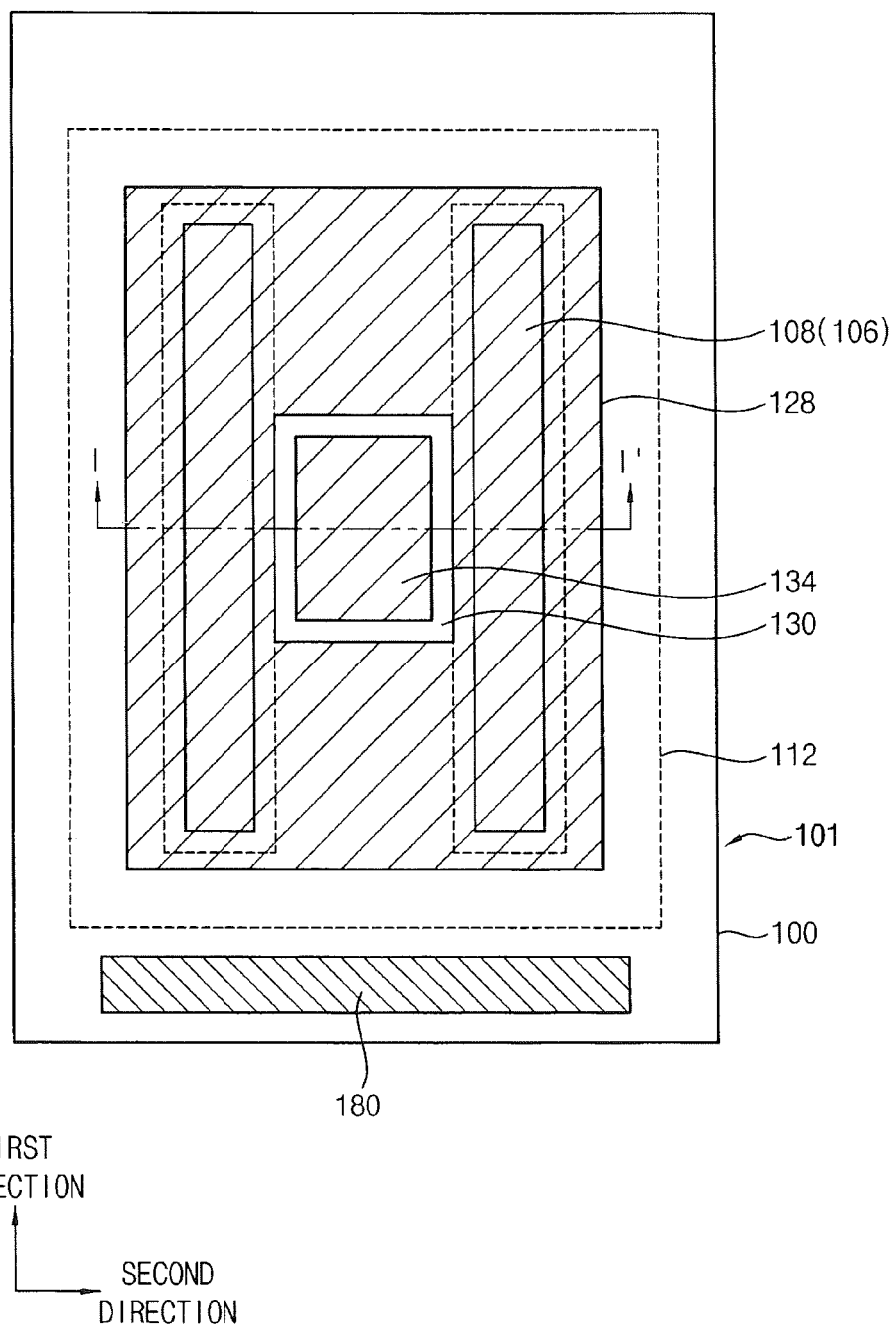
Figure 4:
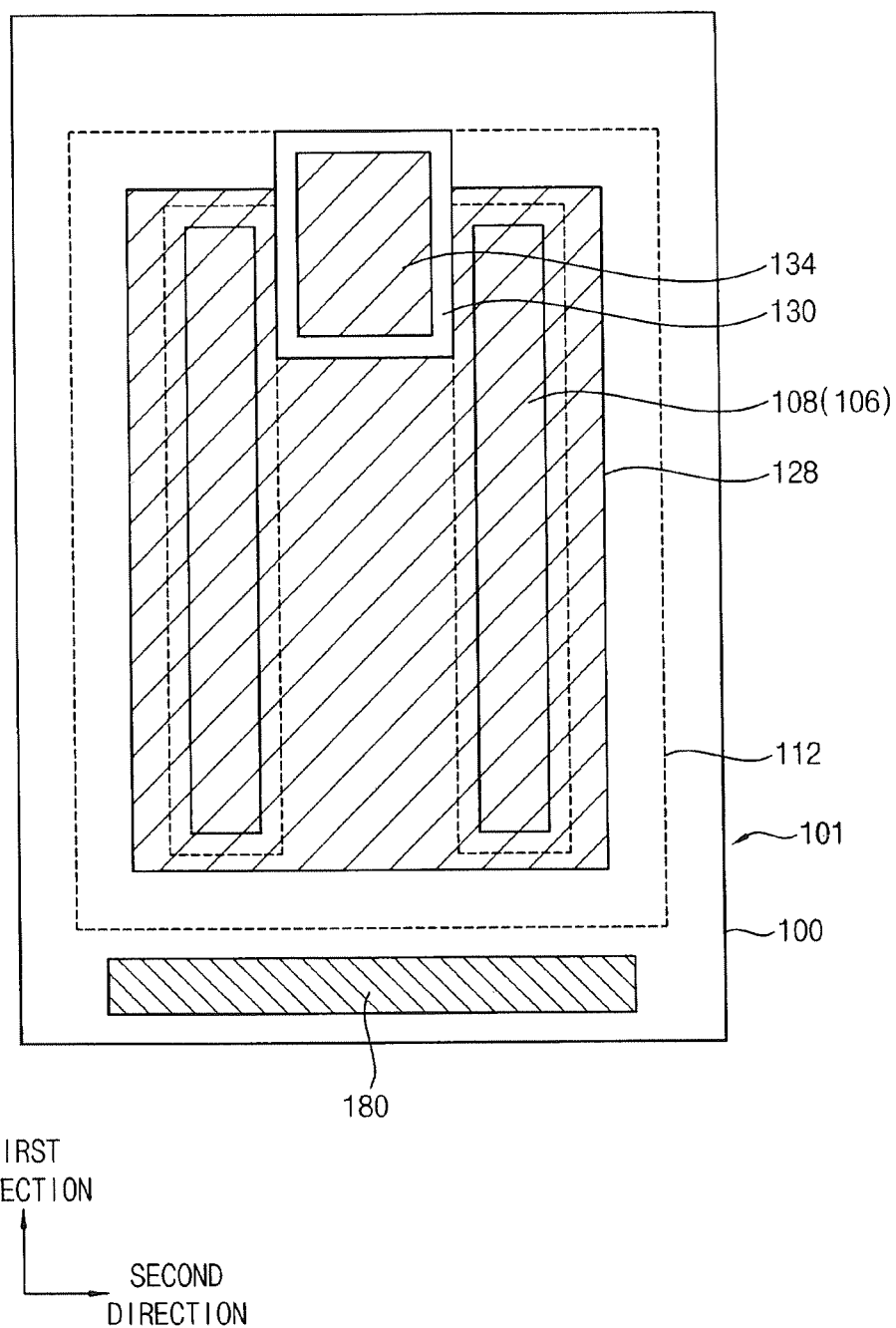
FIGS. 4 and 5 are plan views illustrating semiconductor devices in accordance with example embodiments, respectively.
Figure 5:
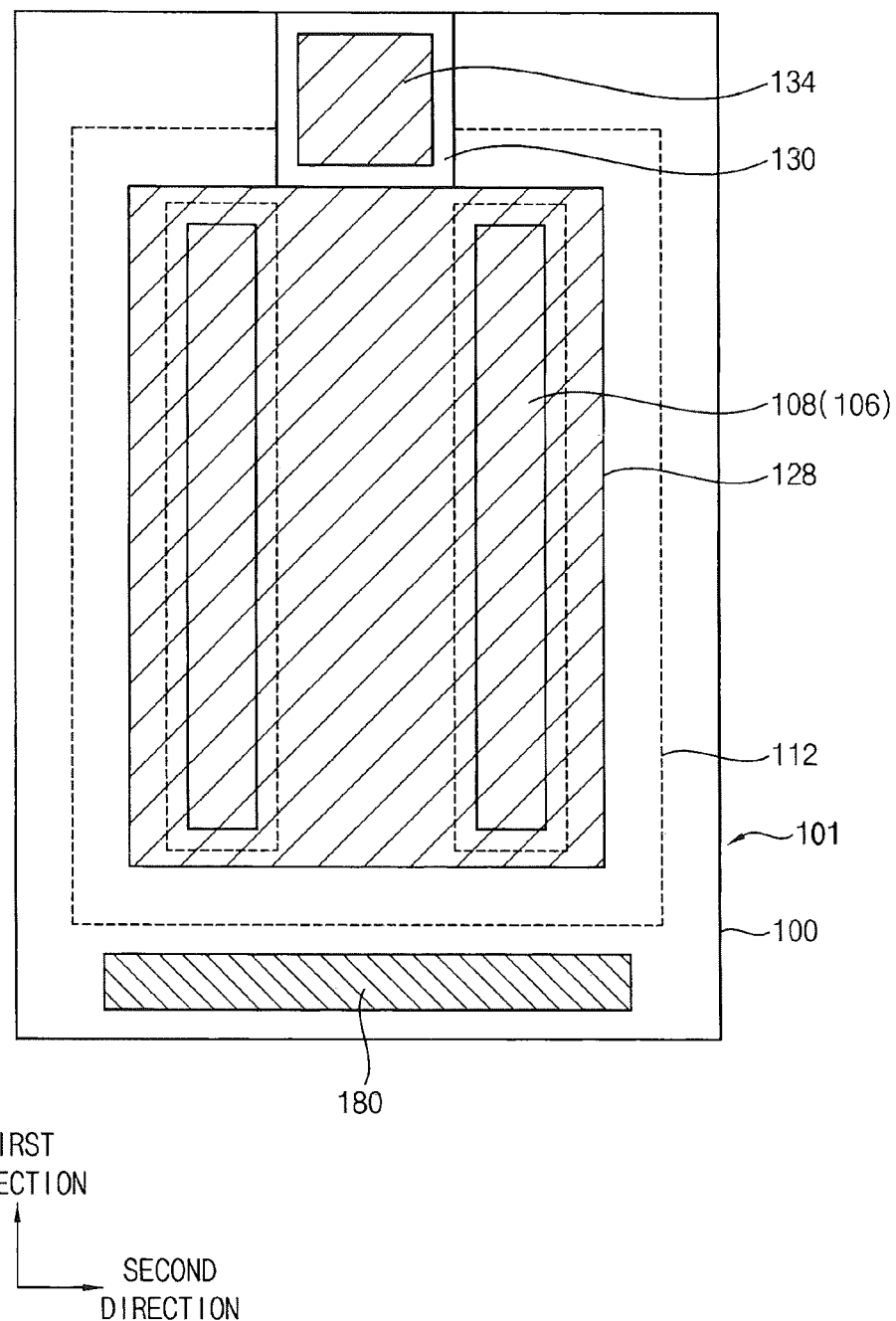

FIGS. 1, 2 and 3 are a cross-sectional view, a perspective view and a plan view illustrating a semiconductor device in accordance with example embodiments, respectively. FIGS. 4 and 5 are plan views illustrating semiconductor devices in accordance with example embodiments, respectively.

FIG. 1 is a cross-sectional view taken along line I-I' of FIG. 3. FIG. 2 is a perspective view illustrating a part of a semiconductor device. FIG. 3 only shows main elements, and some elements are omitted.

The semiconductor device may include a vFET including a channel vertically extending from a surface of a substrate.

Referring to FIGS. 1 to 3, the semiconductor device may be formed on a substrate 100. A first impurity region 102 may be formed on the substrate 100. A plurality of channel patterns 106 may vertically protrude from the surface of the substrate 100. A plurality of second impurity regions 108 may be formed on the channel patterns 106. A gate structure 113 including a gate insulation pattern 110 and a gate electrode 112 may be formed on sidewalls of the channel patterns 106 and the substrate 100 between the channel patterns 106. A first contact pattern 128 may contact the second impurity regions 108, and a second contact pattern 134 may contact the gate electrode 112. A spacer 130 may be formed between the first and second contact patterns 128 and 134. The semiconductor device may further include a first insulating interlayer 116, a capping pattern 114a and a third contact pattern 180 contacting the first impurity region 102.

The substrate 100 may include a semiconductor material, e.g., silicon, germanium, silicon-germanium, etc. The substrate 100 may include an isolation pattern 101. The substrate 100 may be divided into an active region and a field region by the isolation pattern 101. Hereinafter, one vFET formed in the active region may be described.

The first impurity region 102 may serve as one of source/drains of the vFET. The first impurity region 102 may be doped with p-type impurities or n-type impurities according to a conductive type of the vFET. In example embodiments, the first impurity region 102 may be formed on an upper portion of an epitaxial pattern (not shown) on the substrate 100. In some example embodiments, the first impurity region 102 may be formed on an upper portion of the substrate 100.

The channel patterns 106 may extend in the first direction, and may arranged in the second direction. In example embodiments, the vFET may include at least two channel patterns 106. Hereinafter, the vFET including two channel patterns 106 may be described, however the concepts of the invention may not be limited thereto. In some example embodiments, the vFET may include one channel pattern, which may be subsequently illustrated with reference to FIGS. 38 and 39.

The channel pattern 106 may include a semiconductor material, e.g., silicon, germanium, silicon-germanium, etc. In example embodiments, the channel pattern 106 may include a material substantially the same as a material of the substrate 100. In some example embodiments, the channel pattern 106 may include a material different from a material of the substrate 100. In example embodiments, the channel pattern 106 may include an epitaxial pattern.

The second impurity region 108 may be formed on an upper portion of each of the channel pattern 106. The second impurity region 108 may serve as one of source/drains of the vFET. As the plurality of the channel patterns 106 is formed, second impurity regions 108 may be formed on upper portions of the channel patterns, respectively. The second impurity region 108 may extend in the first direction. The second impurity region 108 may be doped with impurities having a conductive type the same as a conductive type of the impurities in the first impurity region 102.

In example embodiments, the second impurity region 108 may be formed in a second epitaxial pattern on the channel pattern 106. In some example embodiments, the second impurity region 108 may be formed in the upper portion of the channel pattern 106. In example embodiments, the second impurity region 108 may have a width in the second direction greater than a width in the second direction of the channel pattern 106.

A first trench may be formed between structures including the channel pattern 106 and the second impurity region 108 stacked. The first trench may extend in the first direction.

The gate structure 113 may be conformally formed on the channel patterns 106 and the first impurity region 102 between the channel patterns 106.

The gate insulation pattern 110 may be conformally formed on the sidewalls of the channel patterns 106 and a surface of the first impurity region 102 between the channel patterns 106. The gate electrode 112 may be conformally formed on the gate insulation pattern 110.

The gate electrode 112 may be spaced apart from each of the first and second impurity regions 102 and 108. For example, the gate electrode 112 may be spaced apart from each of the first and second impurity regions 102 and 108 by the gate insulation pattern 110. The gate electrode 112 may be formed on sidewalls in the first and second directions of the channel patterns 106 and a portion between the channel patterns 106 in the second direction. Thus, the gate electrode 112 formed on the channel patterns 106 may be a shape connected to one another.

In example embodiments, the gate insulation pattern 110 may include a metal oxide having a dielectric constant higher than a dielectric constant of the silicon nitride. The gate insulation pattern 110 may include, e.g., hafnium oxide, tantalum oxide, zirconium oxide, etc., and the gate electrode 112 may include a metal, e.g., cobalt, tungsten etc. A work function control layer (not shown) may be further formed between the gate insulation pattern 110 and the gate electrode 112. The work function control layer may include a metal nitride or a metal alloy, e.g., titanium nitride, titanium aluminum, titanium aluminum nitride, tantalum nitride, tantalum aluminum nitride, etc.

The capping pattern 114a may cover a sidewall of the second impurity region 108 and a surface of the gate structure 113. The capping pattern 114a may include an insulation material, e.g., silicon nitride.

The first insulating interlayer 116 may be formed on the capping pattern 114a. The first insulating interlayer 116 may sufficiently fill the first trench. An upper surface of the first insulating interlayer 116 may be higher than an upper surface of the second impurity region 108.

The first contact pattern 128 may contact the upper surface of the second impurity region 108 through an upper portion of the first insulating interlayer 116. That is, an upper surface of the first contact pattern 128 may be substantially coplanar with the upper surface of the first insulating interlayer 116. A lower surface of the first contact pattern 128 may contact the upper surfaces of the second impurity regions 108 and the first insulating interlayer 116 between the second impurity regions 108.

In example embodiments, one first contact pattern 128 may be formed on entire upper surfaces of the second impurity regions 108 and portions between the second impurity regions 108.

The first contact pattern 128 may include a first barrier pattern 128*a* and a first metal pattern 128*b*. The first barrier pattern 128*a* may include, e.g., titanium, titanium nitride, tantalum, tantalum nitride, etc. The first metal pattern 128*b* may include, e.g., tungsten, cobalt, aluminum, copper, etc. In example embodiments, the first barrier pattern 128*a* may be formed on the first insulating interlayer 116, the capping pattern 114*a* and the second impurity region 108. The first barrier pattern 128*a* may not be formed on a main contact surface between the first contact pattern 128 and an outer sidewall of the spacer 130. That is, the outer sidewall of the spacer 130 may contact the first metal pattern 128*b*.

The second contact pattern 134 may extend through a part of the first contact pattern 128, and the first insulating interlayer 116 and the capping pattern 114*a* thereunder. The second contact pattern 134 may contact a surface of the gate electrode 112. In example embodiments, a lower surface of the second contact pattern 134 may contact the surface of the gate electrode 112 between the channel patterns 106. The lower surface of the second contact pattern 134 may be lower than a lower surface of the first contact pattern 128, In example embodiments, the upper surface of the second contact pattern 134 may be substantially coplanar with the upper surfaces of the first contact pattern 128 and the first insulating interlayer 116.

The second contact pattern 134 may include a second barrier pattern 134*a* and a second metal pattern 134*b*. The second barrier pattern 134*a* may include, e.g., titanium, titanium nitride, tantalum, tantalum nitride, etc. The second metal pattern 134*b* may include, e.g., tungsten, cobalt, aluminum, copper, etc.

The spacer 130 may surround an entire sidewall of the second contact pattern 134. The spacer 130 may contact a sidewall of the first contact pattern 128. The spacer 130 may include an insulation material. The spacer 130 may be formed between the first and second contact patterns 128 and 134, and thus the first and second contact patterns 128 and 134 may be electrically isolated to each other by the spacer 130. The spacer 130 may contact the first and second contact patterns 128 and 134.

In example embodiments, the spacer 130 may include, e.g., silicon nitride. An upper surface of the spacer 130 may be substantially coplanar with the upper surface of the second contact pattern 134. A lower surface of the spacer 130 may be positioned on the upper surface of the gate electrode 112 between the channel patterns 106.

In example embodiments, an inner sidewall of the spacer 130 may contact the second contact pattern 134. The outer sidewall of the spacer 130 may contact the first contact pattern 128, a sidewall of the second impurity region 108, and the surface of the gate electrode 112 formed on the sidewall of the channel pattern 106.

The second contact pattern 134 and the spacer 130 may be formed on a portion between the channel patterns 106, and the portion for forming the second contact pattern 134 and the spacer 130 may not be limited a position in the first direction. A plan view of the transistor may be changed according to a position of the second contact pattern 134.

As shown in FIG. 3, the second contact pattern 134 may extend through the first contact pattern 128. In this case, the spacer 130 may extend through the first contact pattern 128. Thus, the second contact pattern 134 may not be positioned on a portion in which may deviate from the first contact pattern 128.

In example embodiments, as shown in FIG. 4, a portion of the second contact pattern 134 may extend through an edge of the first contact pattern 128. That is, the second contact pattern 134 may be positioned on the edge of the first contact pattern 128 and the portion in which may deviate from the first contact pattern 128. In this case, the spacer 130 may be formed on an inner portion and an outer portion of the first contact pattern 128.

In example embodiments, as shown in FIG. 5, the second contact pattern 134 may be adjacent to the first contact pattern 128 with the spacer 130 disposed therebetween. The second contact pattern 134 may be spaced apart from the edge of the first contact pattern 128 by a width of the spacer 130.

The third contact pattern 180 may be formed on the first impurity region 102 of the substrate 100 through the first insulating interlayer 116. The third contact pattern 180 may be spaced apart from each of the first and second contact patterns 128 and 134.

As described above, the second contact pattern 134 may be adjacent to the first contact pattern 128 with the spacer 130 disposed therebetween. Thus, a horizontal area of the substrate 100 for forming the first and second contact patterns 128 and 134 may decrease.

Figure 6:
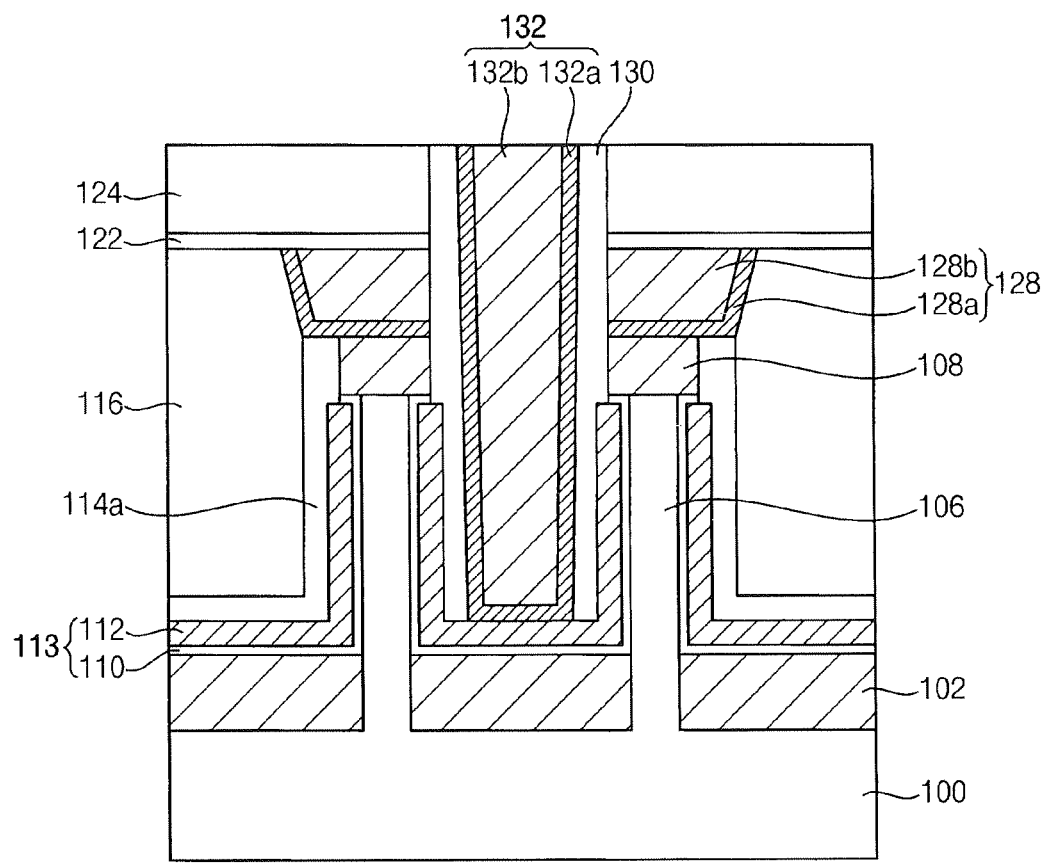
FIG. 6 is a cross-sectional view illustrating a semiconductor device in accordance with example embodiments.

FIG. 6 is a cross-sectional view illustrating a semiconductor device in accordance with example embodiments.

A transistor in the semiconductor device may be substantially the same as or similar to that of FIGS. 1 to 3, except for a stop layer, a second insulating interlayer and an upper surface of the second contact pattern.

Referring to FIG. 6, the stop layer 122 may be formed on the first contact pattern 128 and the first insulating interlayer 116. The second insulating interlayer 124 may be formed on the stop layer 122. In example embodiments, the stop layer 122 may include, e.g., silicon nitride, and the second insulating interlayer 124 may include, e.g., silicon oxide.

A preliminary second contact pattern 132 may extend through the second insulating interlayer 124, the stop layer 122, the part of the first contact pattern 128, the first insulating interlayer 116 and the capping pattern 114*a* thereunder. An upper surface of the preliminary second contact pattern 132 may be substantially coplanar with an upper surface of the second insulating interlayer 124. A height of the upper surface of the preliminary second contact pattern 132 may be different from a height of the upper surface of the first contact pattern 128. That is, the upper surface of the preliminary second contact pattern 132 may be higher than the upper surfaces of the first contact pattern 128 and the first insulating interlayer 116.

The spacer 130 may contact an entire sidewall of the preliminary second contact pattern 132. The upper surface of the spacer 130 may be substantially coplanar with an upper surface of the second insulating interlayer 124. Thus, the upper surface of the spacer 130 may be higher than the upper surfaces of the first contact pattern 128 and the first insulating interlayer 116. The spacer 130 may contact the sidewall of the first contact pattern 128.

FIGS. 7 to 19 are cross-sectional views and plan views illustrating stages of a method of manufacturing a semiconductor device in accordance with example embodiments.

Figure 7:
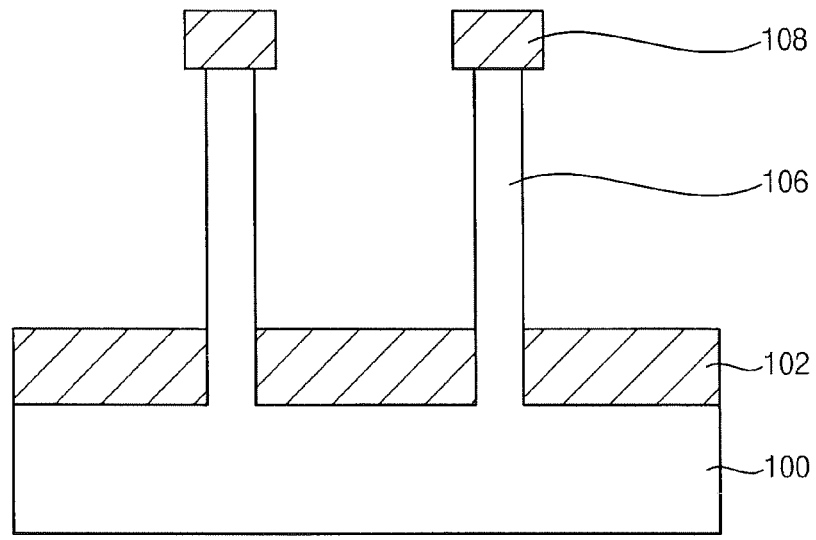
FIGS. 7 to 19 are cross-sectional views and plan views illustrating stages of a method of manufacturing a semiconductor device in accordance with example embodiments.

Referring to FIG. 7, a first impurity region 102 may be formed on a substrate 100

A plurality of channel patterns 106 may be formed on the substrate 100, and the channel patterns 106 may vertically protrude from a surface of the substrate 100. A second impurity region 108 may be formed on the channel patterns 106. The second impurity region 108 may extend in the first direction.

An isolation pattern (101, refer to FIG. 3) may be formed on the substrate 100. A portion of the substrate 100 whose an upper surface is covered by the isolation pattern 101 may serve as a field region, and a portion of the substrate 100 whose an upper surface is not covered by the isolation pattern 101 may serve as an active region.

In example embodiments, the first impurity region 102 may be formed on a first epitaxial pattern (not shown). The first epitaxial pattern may be formed on the active pattern between the channel patterns 106. In some example embodiments, a surface of the substrate 100 may be doped with impurities to form the first impurity region 102. Thus, the first impurity region 102 may be formed on an upper portion of the active region.

In example embodiments, the epitaxial layer may be formed on the substrate 100, and the epitaxial layer may be partially etched to form the channel patterns 106.

In example embodiments, the second impurity region 108 may be formed in a second epitaxial pattern. The second epitaxial pattern may be formed on each of the channel patterns 106. In some example embodiments, upper portions of the channel patterns 106 may be doped with impurities to form the second impurity regions 108. Thus, the second impurity region 108 may be formed on the upper portions of the channel patterns 106.

In example embodiments, the second impurity region 108 may have a width in the second direction greater than a width in the second direction of the channel pattern 106.

Hereinafter, an example of a method of forming the first impurity region 102, the channel pattern 106, and the second impurity region 108 may be described.

The first channel layer may be formed on the substrate 100 by a first epitaxial growth process. The first channel layer may be partially etched to form the channel patterns protruding from the surface of the substrate 100. A second selective epitaxial growth process may be performed on the substrate 100 between the channel patterns and an upper surface of each of the channel patterns 106. During the second selective epitaxial growth process, an impurity doping process may be performed in-situ. Thus, the first epitaxial pattern doped with impurities may be formed on the substrate 100 between the channel patterns 106. Also, the second epitaxial pattern doped with impurities may be formed on each of the channel patterns 106. The first epitaxial pattern may serve as a first impurity region 102, and the second epitaxial pattern may serve as a second impurity region 108.

Figure 8:
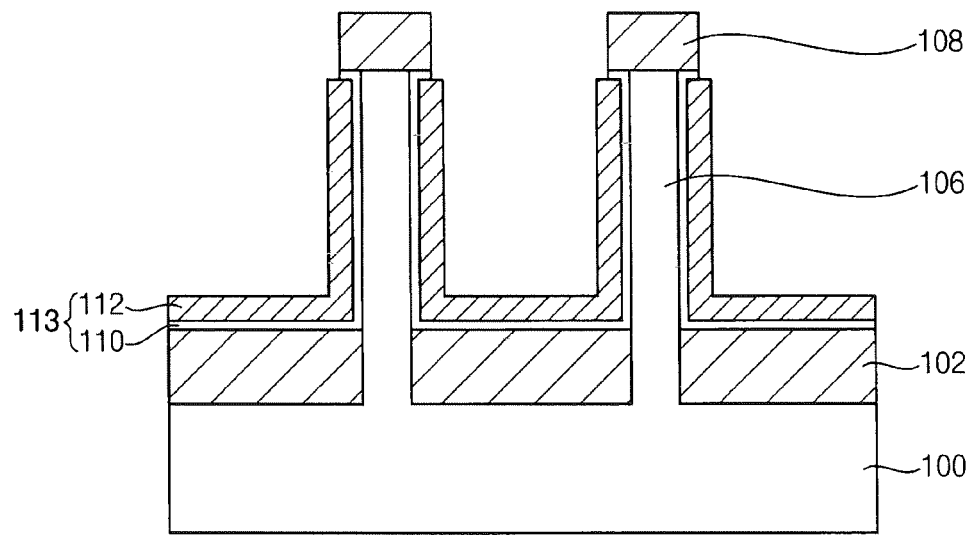
Figure 9:
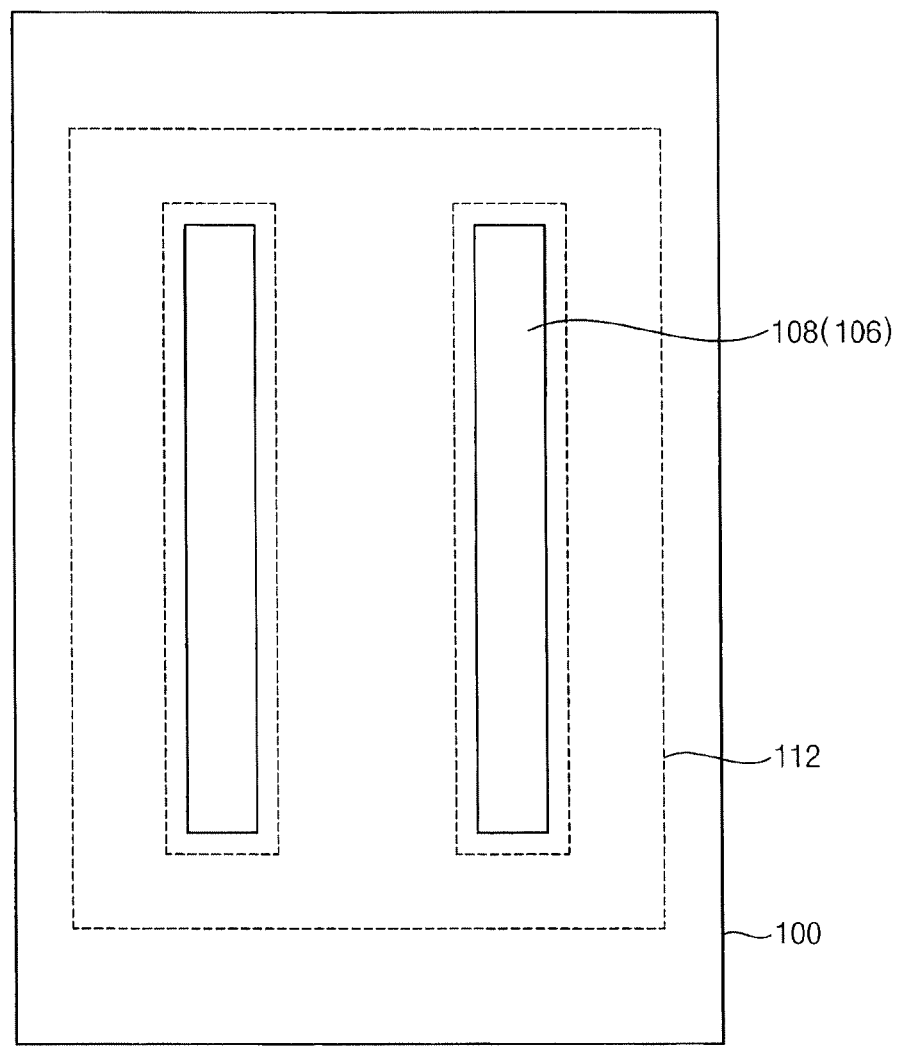

Referring to FIGS. 8 and 9, a gate structure 113 may be formed to cover sidewalls of the channel patterns 106 and the substrate 100 between the channel patterns 106. The gate structure 113 may include a gate insulation pattern 110 and a gate electrode 112.

In example embodiments, a gate insulation layer and a gate electrode layer may be sequentially formed on the channel patterns 106, the substrate 100 between the channel patterns 106, and the second impurity region 108. The gate insulation layer and the gate electrode layer may be partially etched to form the gate insulation pattern 110 and the gate electrode 112.

The gate electrode 112 may surround the sidewalls of the channel patterns 106, and may be formed on the substrate 100 between the channel patterns 106. Thus, the gate electrode 112 formed on the channel patterns 106 may be electrically connected to each other.

The gate insulation pattern 110 may include a metal oxide, e.g., hafnium oxide, tantalum oxide, zirconium oxide, etc., and the gate electrode 112 may include a metal, e.g., tungsten, cobalt, etc. In some example embodiments, a work function control layer (not shown) may be further formed between the gate insulation pattern 110 and the gate electrode 112.

Figure 10:
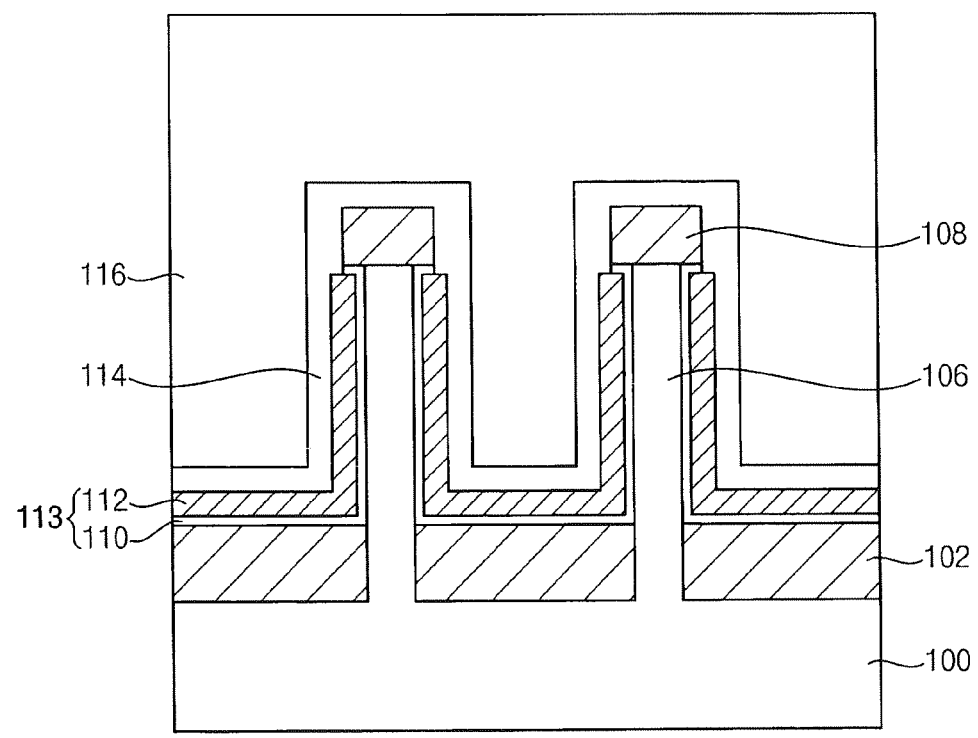

Referring to FIG. 10, a capping layer 114 may be formed to cover a sidewall and an upper surface of the second impurity region 108 and a surface of the gate structure 113. A first insulating interlayer 116 may be formed on the capping layer 114.

The capping layer 114 may be conformally formed on the second impurity region 108 and the gate structure 113. Thus, the capping layer 114 may cover surfaces of the second impurity region 108 and the gate structure 113. The capping layer 114 may include an insulating material. The capping layer 114 may include, e.g., silicon nitride.

The first insulating interlayer 116 may be formed to fill a first trench between the channel patterns 106. The first insulating interlayer 116 may have an upper surface higher than an upper surface of the second impurity region 108. The first insulating interlayer 116 may include, e.g., silicon oxide.

Figure 11:
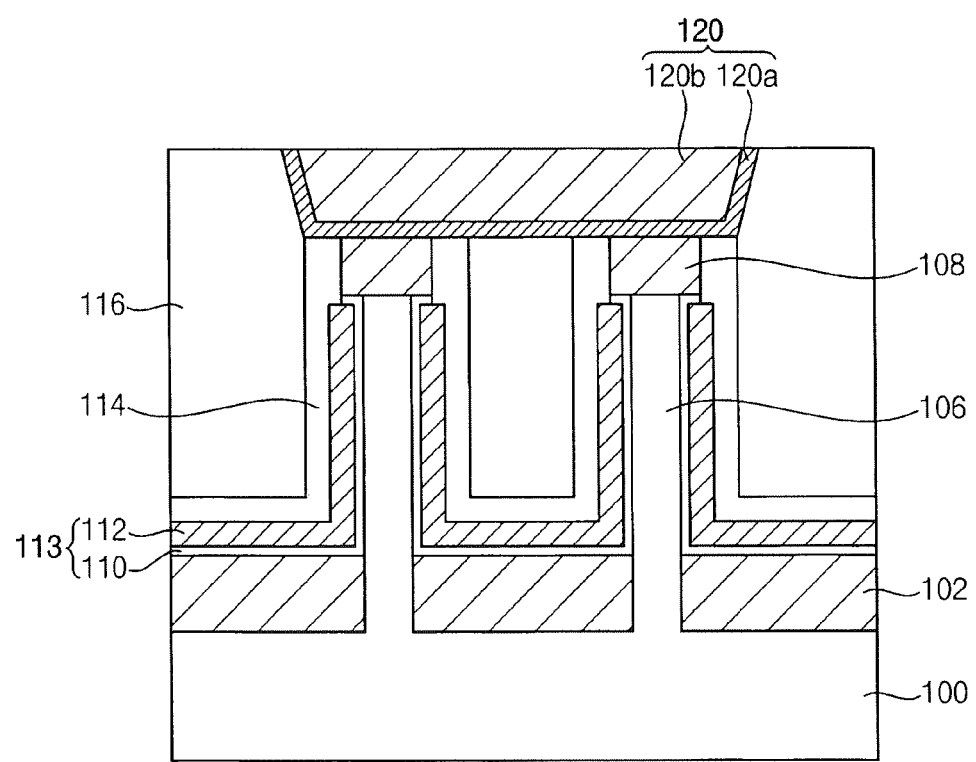
Figure 12:
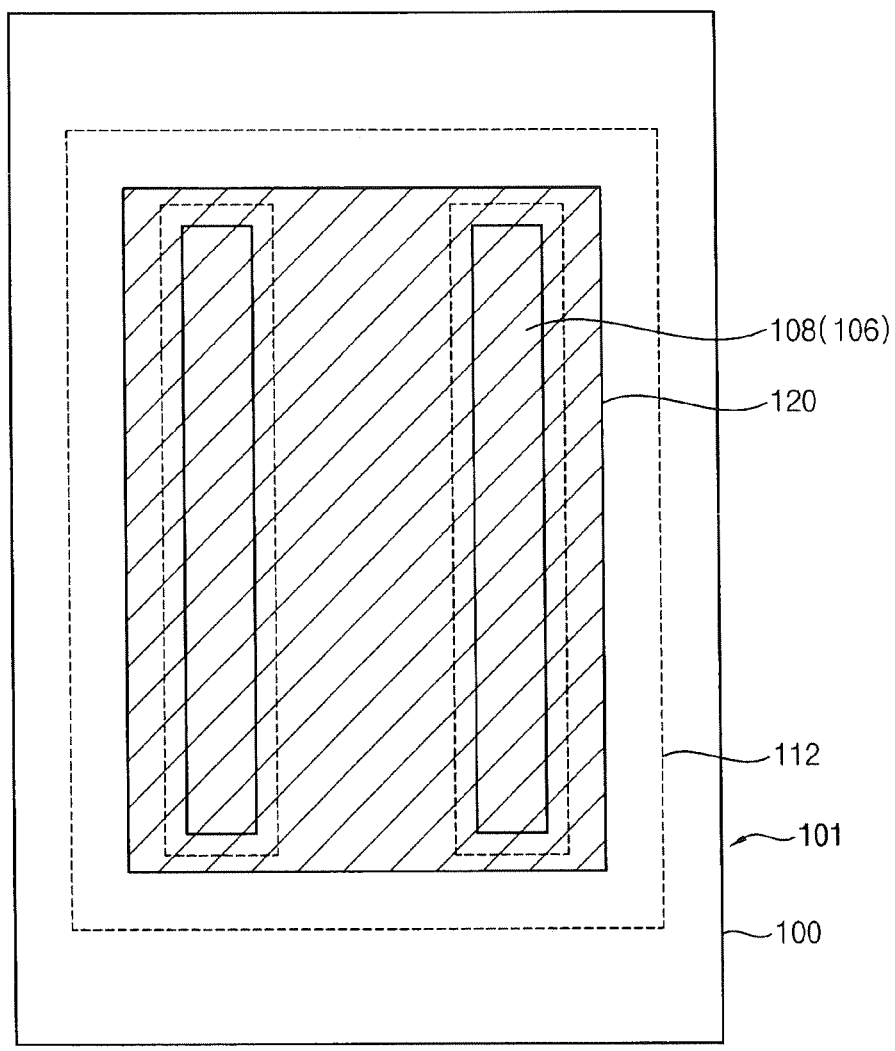
Figure 12:
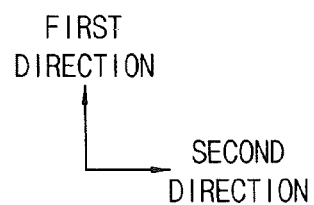

Referring to FIGS. 11 and 12, a preliminary first contact pattern 120 may be formed on the second impurity region 108 through an upper portion of the first insulating interlayer 116. The preliminary first contact pattern 120 may include a preliminary first barrier pattern 120a and a preliminary first metal pattern 120b.

Particularly, the first insulating interlayer 116 may be partially etched to form an opening exposing the upper surface of the second impurity region 108. In example embodiments, the etching process may include an anisotropic etching process. The plurality of second impurity regions 108 included in one transistor may be exposed by the opening. The second impurity regions 108 and the first insulating interlayer 116 between the second impurity regions 108 may be exposed by the opening.

A first barrier layer may be conformally formed on the opening and the first insulating interlayer 116. A first metal layer may be formed on the first barrier layer to fill the opening. The first metal layer and the first barrier layer may be planarized until the upper surface of the first insulating interlayer 116 may be exposed to form the preliminary first contact pattern 120 including the preliminary first barrier pattern 120a and the preliminary first metal pattern 120b. The preliminary first contact pattern 120 may be formed in the opening. During the planarization process, an upper portion of the first insulating interlayer 116 may be removed, so that a height of the first insulating interlayer 116 may be slightly lowered.

Figure 13:
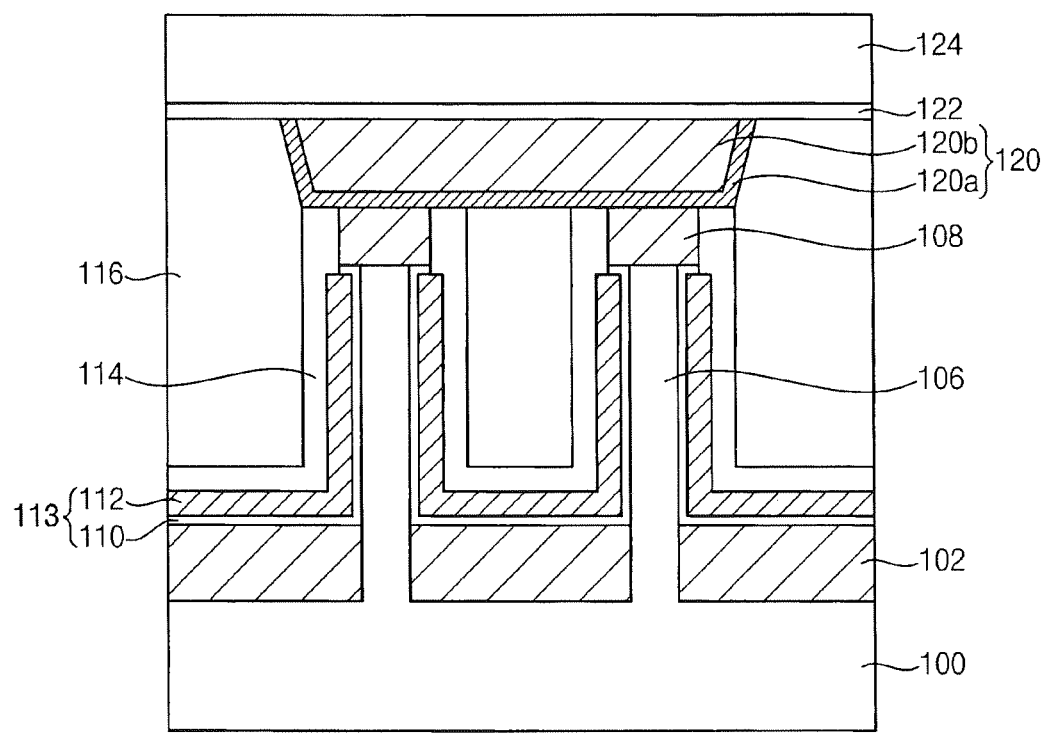

Referring to FIG. 13, a stop layer 122 and a second insulating interlayer 124 may be sequentially formed on the preliminary first contact pattern 120 and the first insulating interlayer 116. The stop layer 122 and the second insulating interlayer 124 may cover the preliminary first contact pattern 120 and the first insulating interlayer 116.

In example embodiments, the stop layer 122 may include, e.g., silicon nitride. The second insulating interlayer 124 may include, e.g., silicon oxide.

Figure 14:
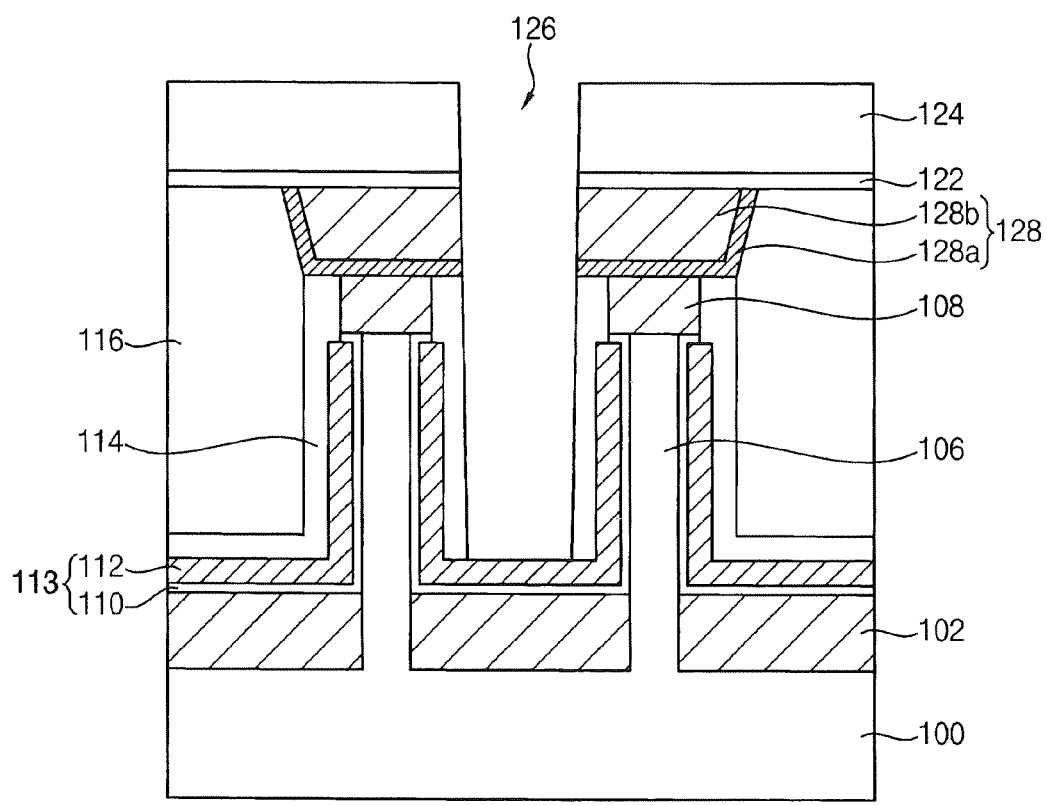

Referring to FIG. 14, an etching mask (not shown) may be formed on the second insulating interlayer 124. The etching mask may include an opening vertically overlapping with a portion between the channel patterns 106.

The second insulating interlayer 124, the stop layer 122, the preliminary first contact pattern 120, the first insulating interlayer 116 and the capping layer 114 may be etched using the etching mask to form a preliminary contact hole 126. In example embodiments, the etching process may include an anisotropic etching process. An upper surface of the gate electrode 112 between the channel patterns 106 may be exposed by a bottom of the preliminary contact hole 126. The capping layer 114 may be exposed by a sidewall of the preliminary contact hole 126.

In the etching process, the preliminary first contact pattern 120 may be partially etched to form a first contact pattern 128. The first contact pattern 128 may include a first barrier pattern 128*a* and a first metal pattern 128*b*. The first barrier pattern 128*a* may not be formed on the sidewall of the preliminary contact hole 126.

In example embodiments, a position of the preliminary contact hole 126 may be changed according to a position of the opening of the etching mask. That is, one of the semiconductor devices shown in FIGS. 1, 4 and 5 may be manufactured by a change of the position of the preliminary contact hole 126.

Figure 15:
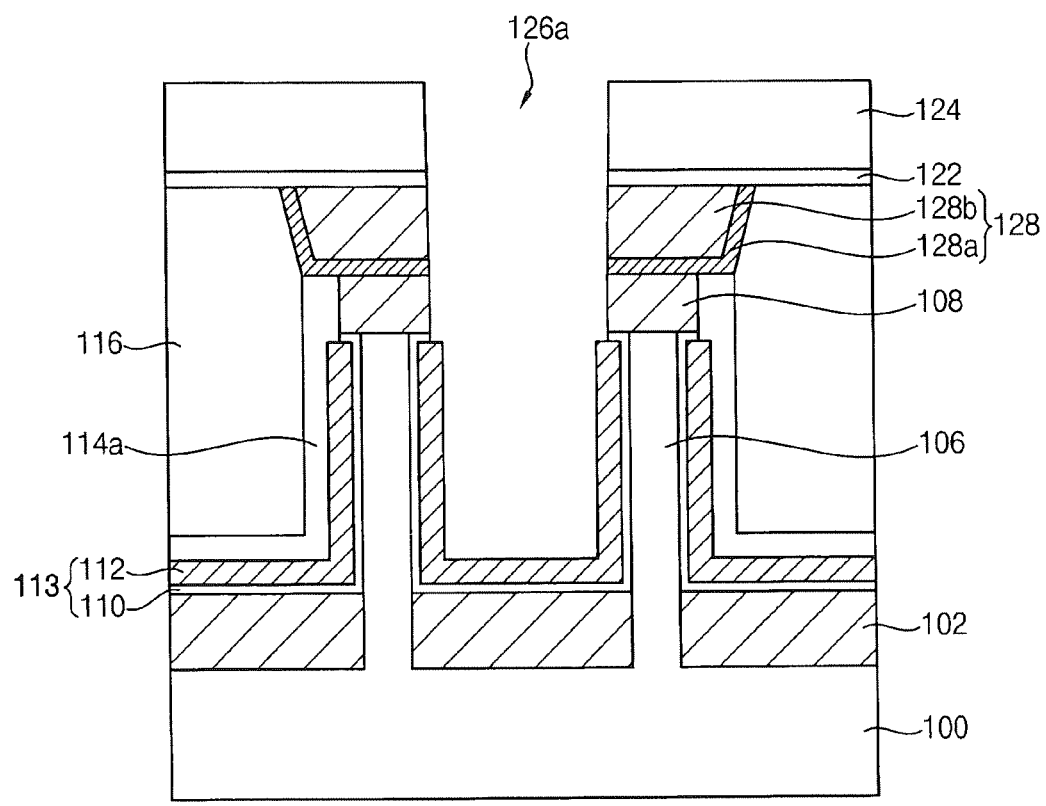
Figure 16:
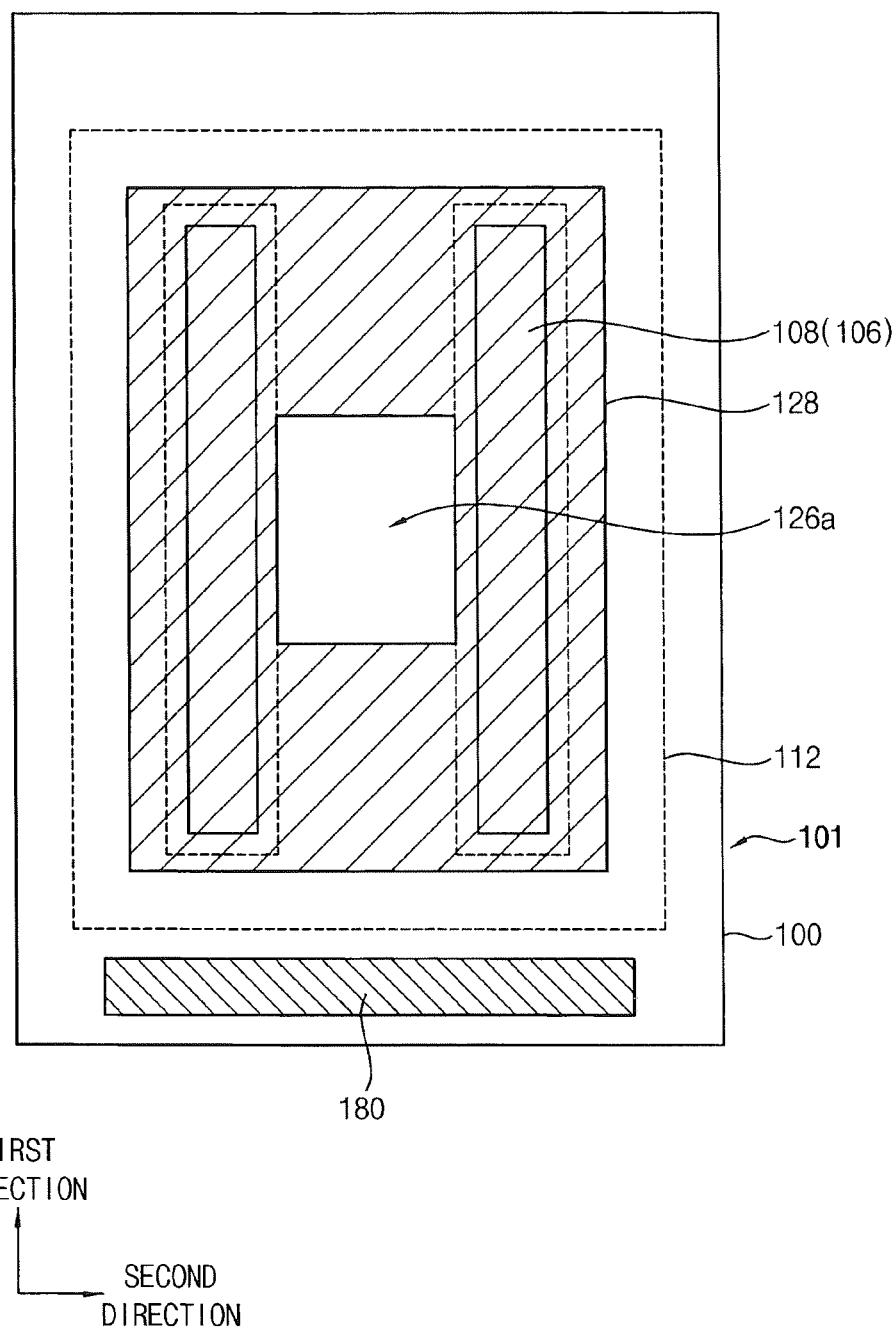

Referring to FIGS. 15 and 16, the capping layer 114 exposed by the sidewall of the preliminary contact hole 126 may be removed to form a contact hole 126*a*. In example embodiments, the removing process may include an isotropic etching process. During partially removing the capping layer 114, the stop layer 122 exposed by the preliminary contact hole 126 may be partially etched.

A surface of the gate electrode 112 may be exposed by a sidewall and a bottom of the contact hole 126*a*. The capping layer 114 may be partially etched to faun a capping pattern 114*a*. A sidewall of the first contact pattern 128 may be exposed by an upper sidewall of the contact hole 126*a*.

Figure 17:
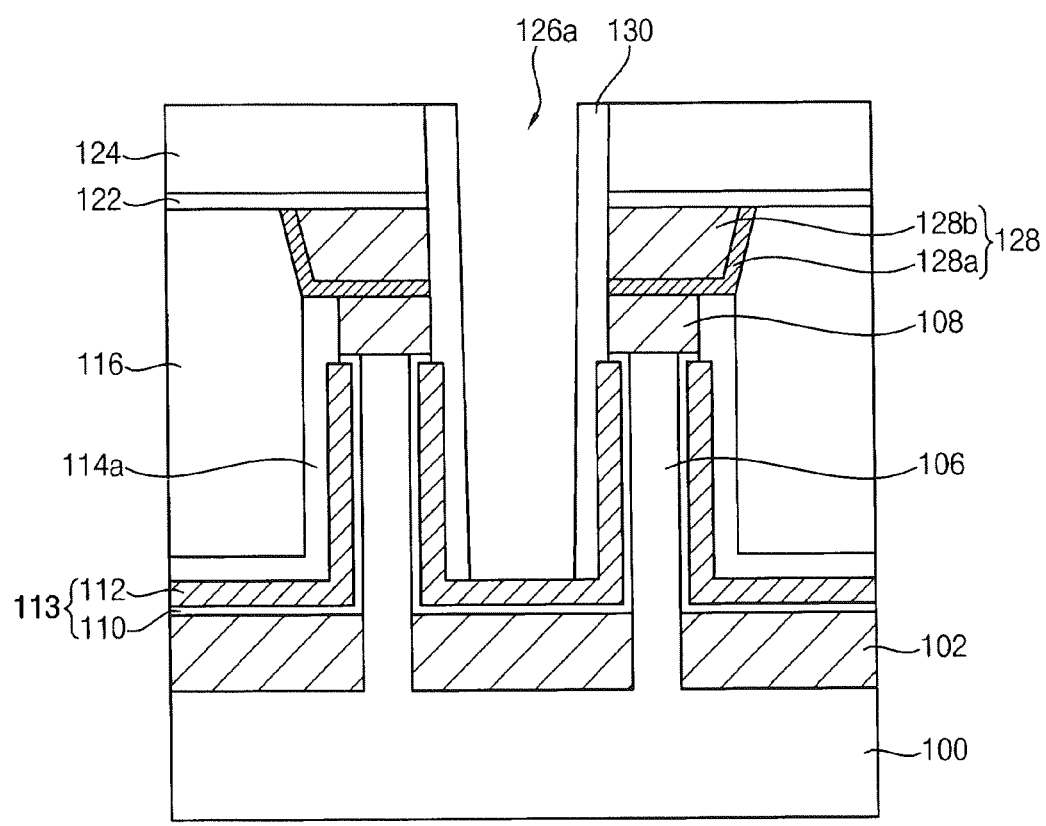

Referring to FIG. 17, a spacer layer may be conformally formed on the sidewall and bottom of the contact hole 126*a* and the upper surface of the second insulating interlayer 124. The spacer layer may be anisotropically etched to form a spacer 130 on the sidewall of the contact hole 126*a*.

The spacer 130 may include, e.g., silicon nitride. The spacer 130 may contact the first contact pattern 128, the sidewall of the second impurity region 108 and the surface of the gate electrode 112 formed on the sidewall of the channel pattern 106.

Figure 18:
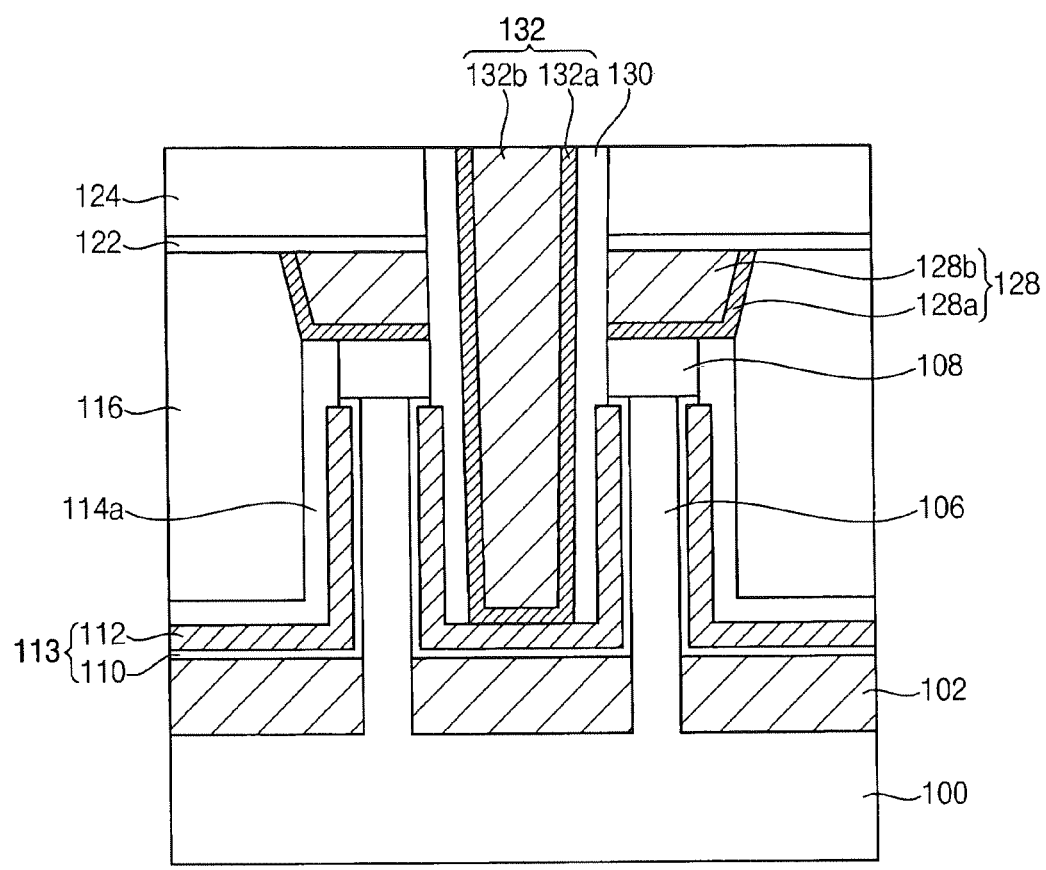

Referring to FIG. 18, a conductive layer may be formed on the second insulating interlayer 124 to fill the contact hole 126*a*. The conductive layer may be planarized until the upper surface of the second insulating interlayer 124 may be exposed to form preliminary second contact pattern 132.

Particularly, a second barrier layer may be conformally formed on the sidewall and the bottom of the contact hole 126*a* and the upper surface of the second insulating interlayer 124. A second metal layer may be formed on the second barrier layer. The second barrier layer and the second metal layer may be planarized to form the preliminary second contact pattern 132. The preliminary second contact pattern 132 may include a preliminary second barrier pattern 132*a* and a preliminary second metal pattern 132*b*.

In some example embodiments, a subsequent planarization process may not be performed, so that the preliminary second contact pattern may serve as a second contact pattern. In this case, the semiconductor device shown in FIG. 6 may be manufactured. That is, an upper surface of the second contact pattern may be higher than an upper surface of the first contact pattern 128. In other example embodiments, the upper surface of the second contact pattern may be substantially coplanar with the upper surface of the second insulating interlayer 124.

Figure 19:
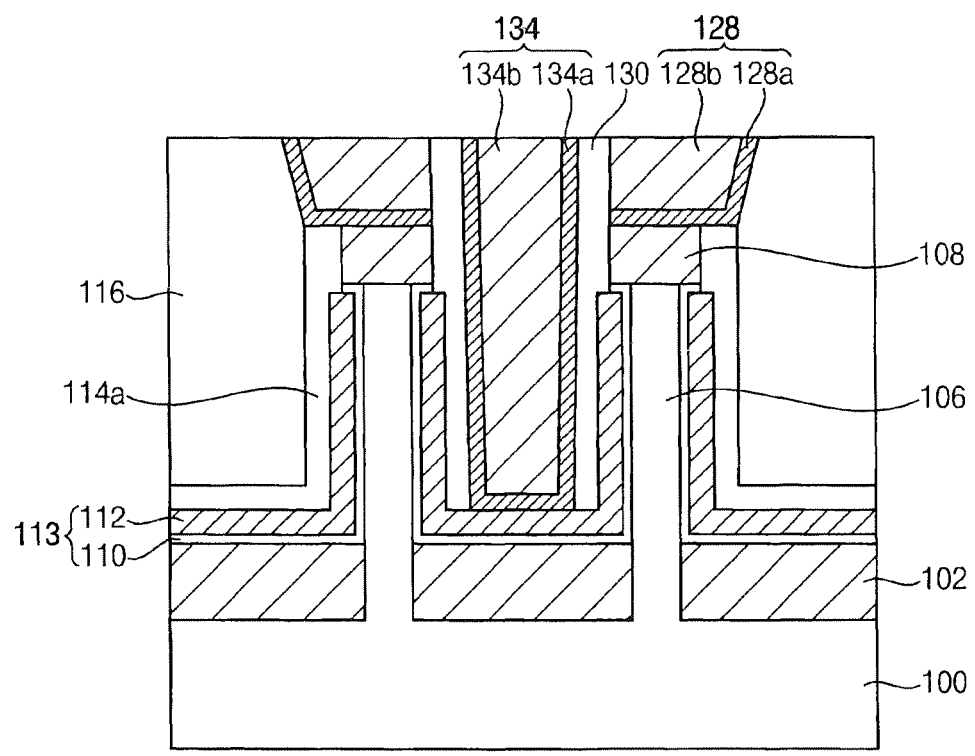

Referring to FIG. 19, the preliminary second contact pattern 132, the second insulating interlayer 124 and the stop layer 122 may be planarized until the upper surface of the first contact pattern 128 may be exposed. Thus, the second insulating interlayer 124 and the stop layer 122 may be removed, and an upper portion of the preliminary second contact pattern 132 may be etched to form a second contact pattern 134. An upper surface of the second contact pattern 134 may be substantially coplanar with the upper surface of the first contact pattern 128 and the first insulating interlayer 116.

Figure 20:
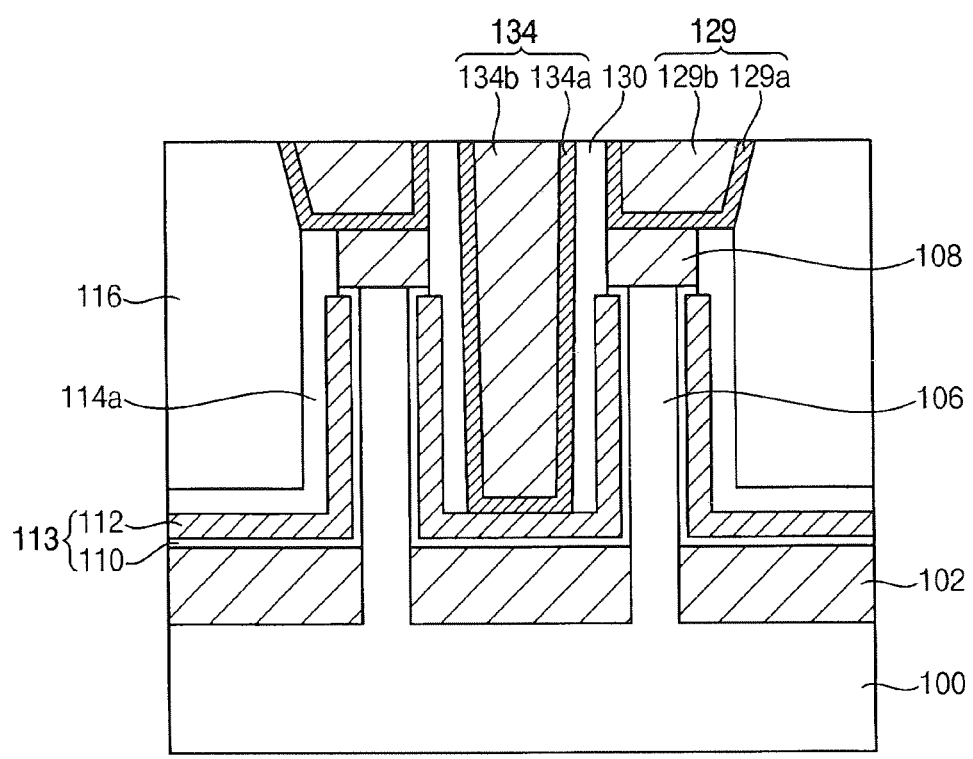
FIG. 20 is a cross-sectional view illustrating a semiconductor device in accordance with example embodiments.

FIG. 20 is a cross-sectional view illustrating a semiconductor device in accordance with example embodiments.

This semiconductor device may be substantially the same as or similar to that of FIGS. 1 to 3, except for a shape of the first contact pattern.

Referring to FIG. 20, the first contact pattern 129 may contact upper surfaces of the second impurity regions 108 through an upper portion of the first insulating interlayer 116.

In example embodiments, the first contact pattern 129 may include the first barrier pattern 129*a* and the first metal pattern 129*b*. The first barrier pattern 129*a* may be formed on the first insulating interlayer 116, the capping pattern 114*a*, the second impurity region 108 and an outer sidewall of the spacer 130. The first barrier pattern 129*a* may be positioned on a contact surface between the first contact pattern 129 and the outer sidewall of the spacer 130. That is, the outer sidewall of the spacer 130 may contact the first barrier pattern 129*a*. The first metal pattern 129*b* may be formed on the first barrier pattern 129*a*.

The second contact pattern 134 and the spacer 130 may be formed on a portion between the channel patterns 106, and the portion for forming the second contact pattern 134 and the spacer 130 may not be limited a position in the first direction.

FIGS. 21 to 24 are cross-sectional views illustrating stages of a method of manufacturing a semiconductor device in accordance with example embodiments. The semiconductor device may be the semiconductor device shown in FIG. 20.

Figure 21:
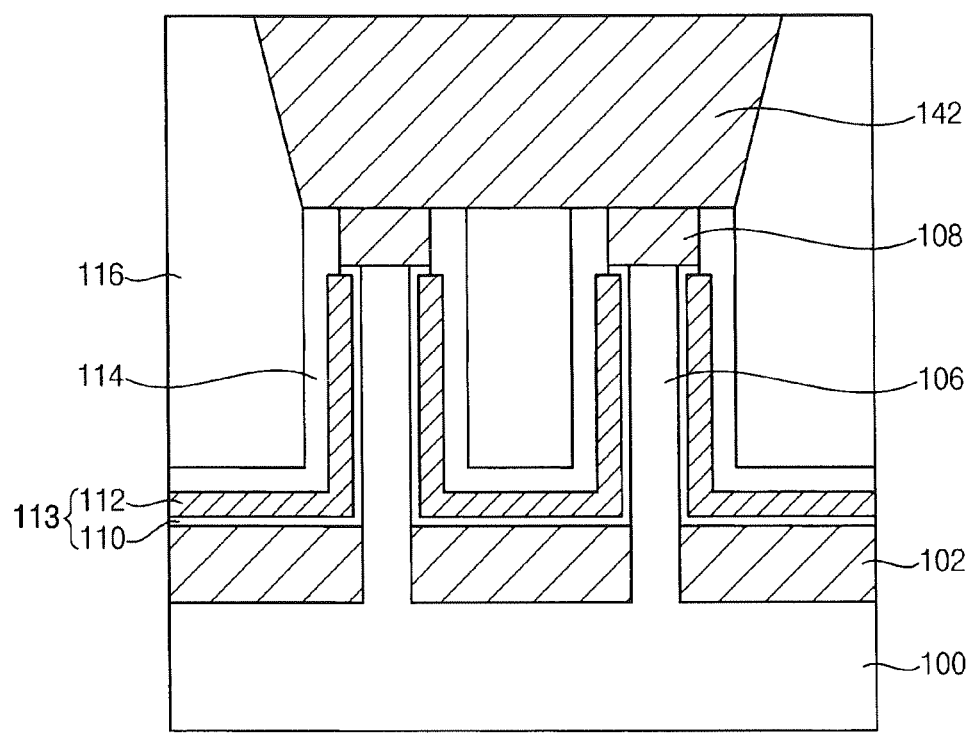
FIGS. 21 to 24 are cross-sectional views illustrating stages of a method of manufacturing a semiconductor device in accordance with example embodiments.

Referring to FIG. 21, processes substantially the same as or similar to those illustrated with reference to FIGS. 7 to 10 may be performed.

A dummy pattern 142 may be formed on the second impurity region 108 through an upper portion of the first insulating interlayer 116. In example embodiments, the dummy pattern 142 may be formed of, e.g., polysilicon.

Particularly, the first insulating interlayer 116 may be partially etched to form an opening exposing an upper surface of the second impurity region 108. In example embodiments, the plurality of second impurity regions 108 included in one transistor may be exposed by the opening. The second impurity regions 108 and the first insulating interlayer 116 between the second impurity regions 108 may be exposed by the opening.

A polysilicon layer may be formed on the first insulating interlayer 116 to fill the opening. The polysilicon layer may be planarized until an upper surface of the first insulating interlayer 116 may be exposed to form the dummy pattern 142 in the opening.

Figure 22:
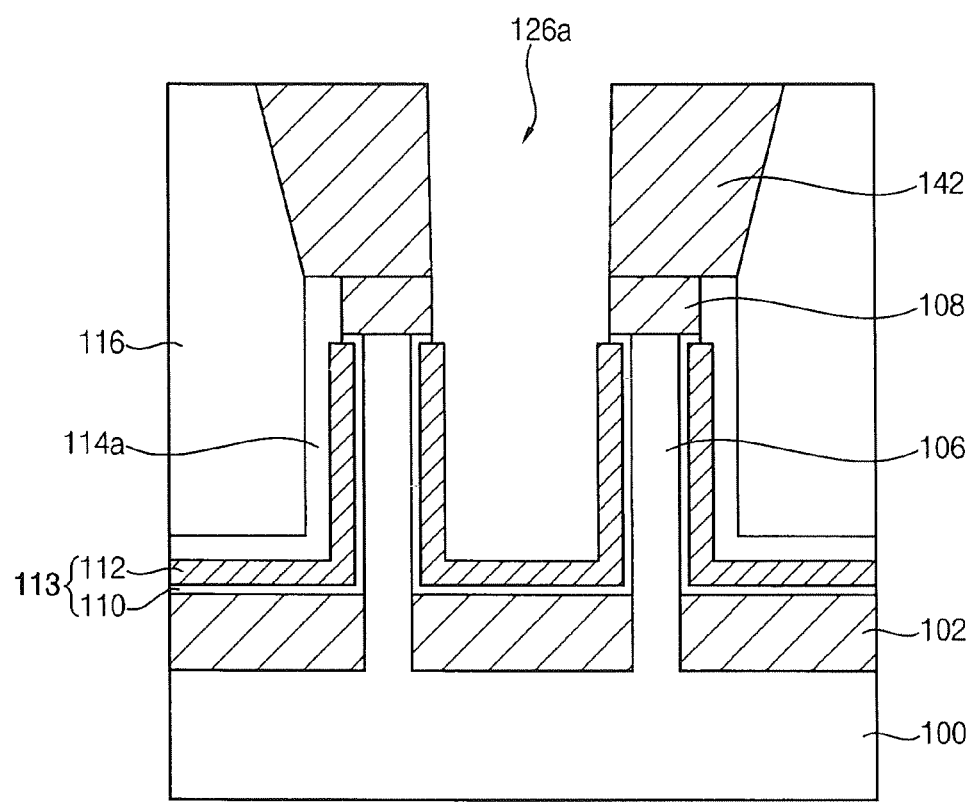

Referring to FIG. 22, the dummy pattern 142, the first insulating interlayer 116 and the capping layer 114 may be etched to form a contact hole 126*a* exposing the gate electrode 112.

Particularly, an etching mask may be formed on the dummy pattern 142 and the first insulating interlayer 116. The etching mask may include an opening vertically overlapping with a portion between the channel patterns 106. The dummy pattern 142, the first insulating interlayer 116 and the capping layer 114 may be etched using the etching mask to form a preliminary contact hole. The upper surface of the gate electrode 112 between the channel patterns 106 may be exposed by a bottom of the preliminary contact hole. The capping layer 114 may be exposed by a sidewall of the preliminary contact hole. In example embodiments, the etching process may include an anisotropic etching process.

The capping layer 114 exposed by the sidewall of the preliminary contact hole may be removed to form the contact hole 126a. The surface of the gate electrode 112 may be exposed by the sidewall and the bottom of the contact hole 126a. The capping layer 114 may be partially etched to form the capping pattern 114a. In example embodiments, the etching process may include an isotropic etching process.

Figure 23:
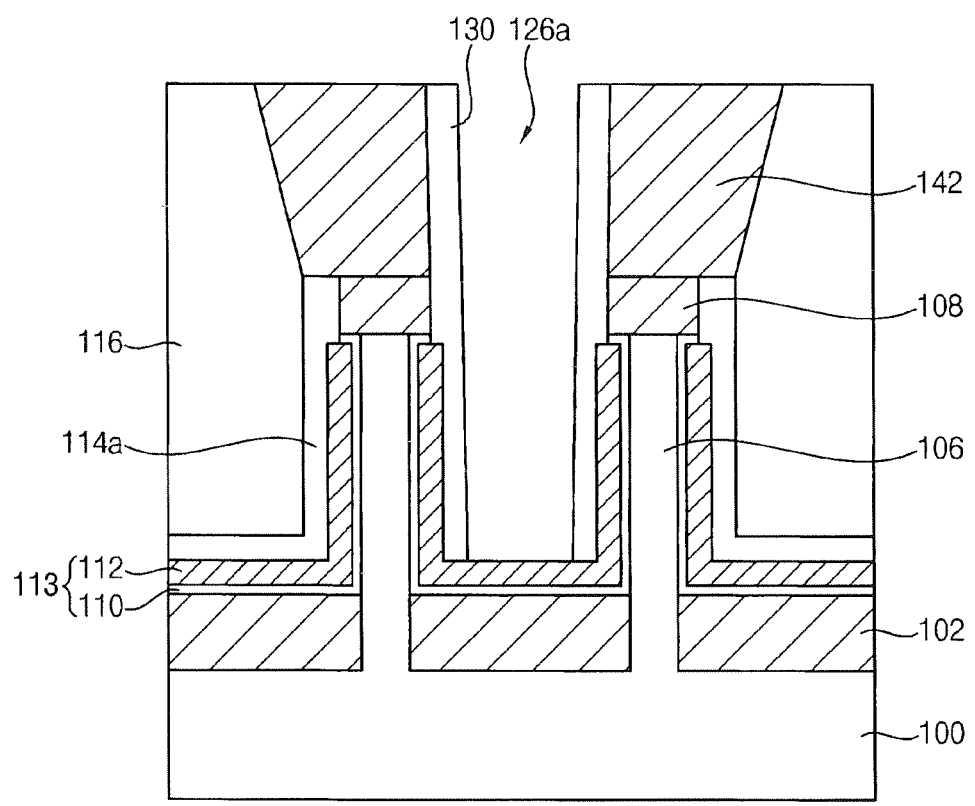

Referring to FIG. 23, the spacer layer may be formed on the sidewall and the bottom of the contact hole 126a and upper surfaces of the first insulating interlayer 116 and the dummy pattern 142. The spacer layer may be anisotropically etched to form the spacer 130.

The spacer 130 may include, e.g. silicon nitride. The spacer 130 may contact sidewalls of the dummy pattern 142 and the second impurity region 108 and the surface of the gate electrode 112 formed on the sidewall of the channel pattern 106.

Figure 24:
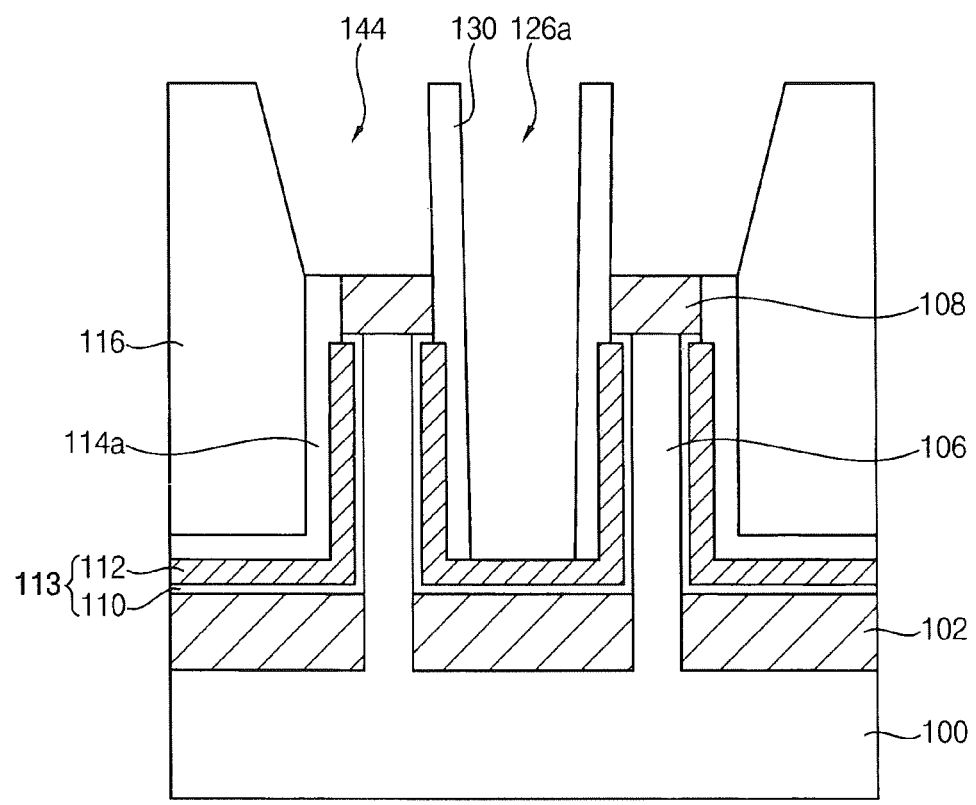

Referring to FIG. 24, the dummy pattern 142 may be removed to form an opening 144.

Thus, the opening 144 and the contact hole 126a may be formed through the first insulating interlayer 116. The opening 144 and the contact hole 126a may be separated from each other by the spacer 130.

Referring to FIG. 20 again, the conductive layer may be formed on the first insulating interlayer 116 to fill the opening 144 and the contact hole 126a. The conductive layer may be planarized until the upper surface of the first insulating interlayer 116 may be exposed to form the first contact pattern 129 in the opening 144 and the second contact pattern 134 in the contact hole 126a. In example embodiments, the first contact pattern 129 may include the first barrier pattern 129a and the first metal pattern 129b. The second contact pattern 134 may include the second barrier pattern 134a and the second metal pattern 134b.

Particularly, the barrier layer may be formed on the sidewalls and the bottoms of the opening 144 and the contact hole 126a and the upper surface of the first insulating interlayer 116. The metal layer may be formed on the barrier layer. The barrier layer may be formed on an exposed surface of the spacer 130. The metal layer and the barrier layer may be planarized to form the first contact pattern 129 filling the opening 144 and the second contact pattern 134 filling the contact hole 126a. The first barrier pattern 129a may be positioned on a contact surface between the first contact pattern 129 and the outer sidewall of the spacer 130. The outer sidewall of the spacer 130 may contact the first barrier pattern 129a.

Figure 25:
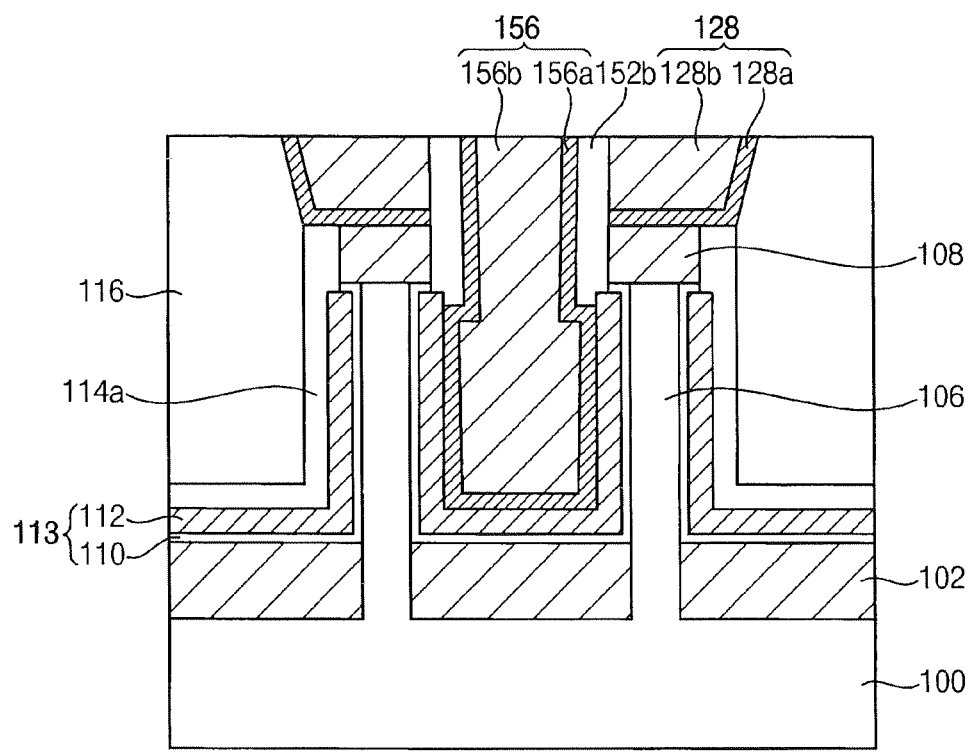
FIG. 25 is a cross-sectional view illustrating a semiconductor device in accordance with example embodiments.

FIG. 25 is a cross-sectional view illustrating a semiconductor device in accordance with example embodiments.

This semiconductor device may be substantially the same as or similar to that of FIGS. 1 to 3, except for shapes of the spacer and the second contact pattern.

Referring to FIG. 25, the second contact pattern 156 may through a part of the first contact pattern 128, the first insulating interlayer 116 and the capping pattern 114a thereunder. The second contact pattern 156 may contact a surface of the gate electrode 112. In example embodiments, a lower surface of the second contact pattern 156 may contact a surface of the gate electrode 112 between the channel patterns 106. A sidewall of the second contact pattern 156 may contact a surface of the gate electrode 112 formed on sidewalls of the channel patterns 106.

The spacer 152b may surround an upper sidewall of the second contact pattern 156. A portion of the spacer may contact the first contact pattern.

In example embodiments, an upper surface of the spacer 152b may be substantially coplanar with an upper surface of the second contact pattern 156. A lower surface of the spacer 152b may be lower than a lower surface of the second impurity region 108, and may higher than the surface of the gate electrode 112 between the channel patterns.

In example embodiments, an inner sidewall of the spacer 152b may contact the upper sidewall of the second contact pattern 156. An outer sidewall of the spacer 152b may contact sidewalls of the first contact pattern 128 and the second impurity region 108.

A portion of the second contact pattern 156 under the lower surface of the spacer 152b may have a width in the second direction greater than a width in the second direction of a portion of the second contact pattern 156 over the lower surface of the spacer 152b.

In example embodiments, the upper surface of the second contact pattern 156 may be substantially coplanar with upper surfaces of the first contact pattern 128 and the first insulating interlayer 116.

Figure 30:
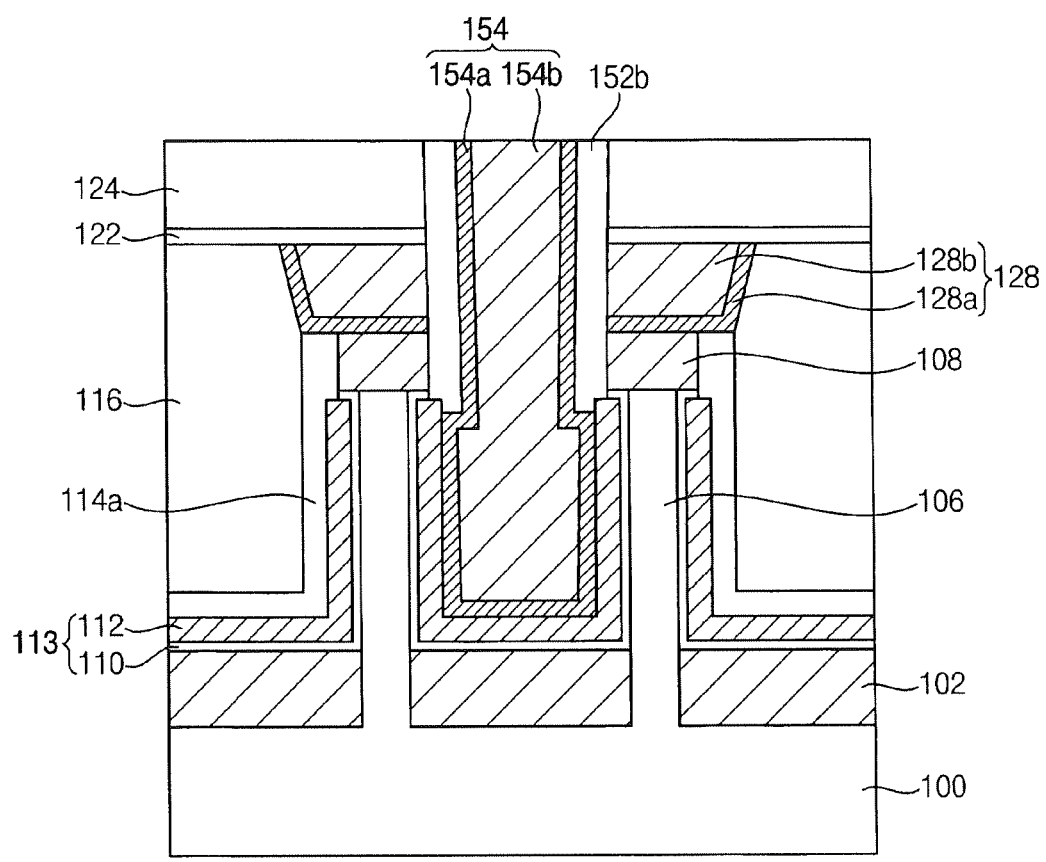

In some example embodiments, as shown in FIG. 30, the upper surface of the second contact pattern may be higher than upper surfaces of the first contact pattern 127 and the first insulating interlayer 116.

The second contact pattern 156 and the spacer 152b may be formed on a portion between the channel patterns 106, and the portion for forming the second contact pattern 156 and the spacer 152b may not be limited a position in the first direction.

FIGS. 26 to 31 are cross-sectional views illustrating stages of a method of manufacturing a semiconductor device in accordance with example embodiments. The semiconductor device may be the semiconductor device shown in FIG. 25.

Figure 26:
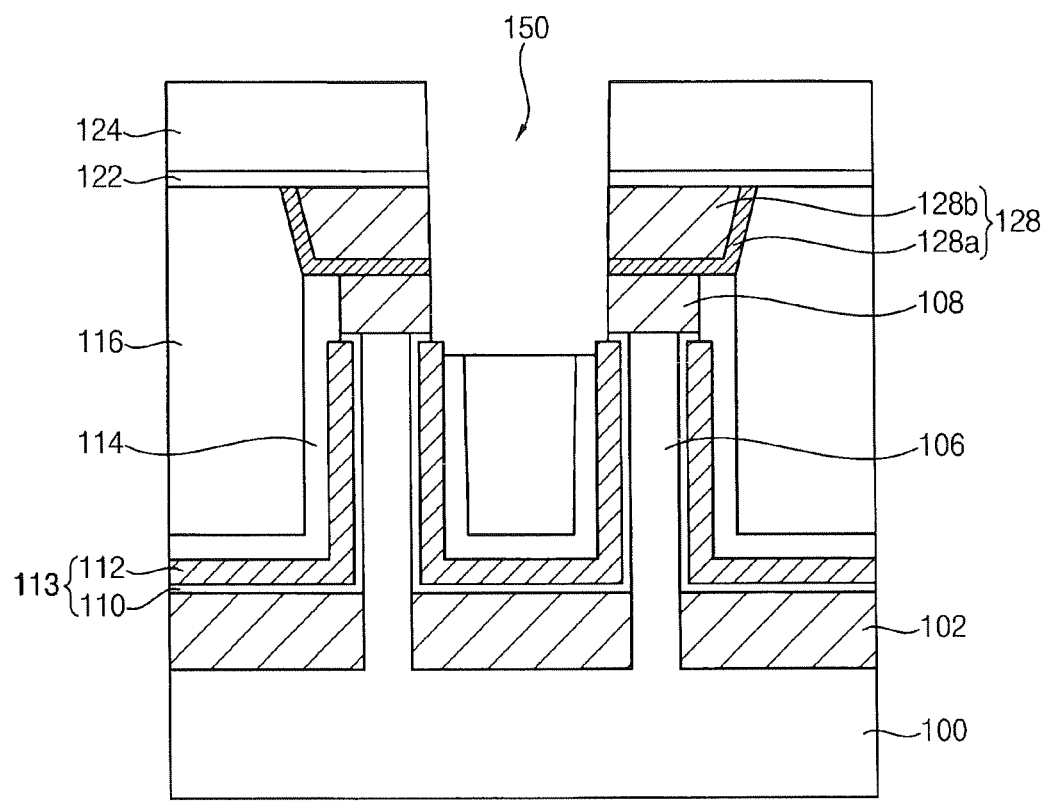
FIGS. 26 to 31 are cross-sectional views illustrating stages of a method of manufacturing a semiconductor device in accordance with example embodiments.

Referring to FIG. 26, processes substantially the same as or similar to those illustrated with reference to FIGS. 7 to 13 may be performed.

An etching mask (not shown) may be formed on the second insulating interlayer 124. The etching mask may include an opening vertically overlapping with a portion between the channel patterns 106. The second insulating interlayer 124, the stop layer 122, the preliminary first contact pattern, the first insulating interlayer 116 and the capping layer 114 may be etched to form a preliminary first contact hole 150. A bottom of the preliminary first contact hole 150 may be lower than a lower surface of the second impurity region 108, and may be higher than a surface of the gate electrode 112 between the channel patterns 106. Thus, the first insulating interlayer 116 may partially remain between the channel patterns 106.

In example embodiments, the etching process may include an anisotropic etching process. The preliminary first contact pattern 120 (refer to FIG. 13) may be partially etched by the etching process to form a first contact pattern 128. The first contact pattern 128 may include the first barrier pattern 128a and the first metal pattern 128b. In example embodiments, the first barrier pattern 128a may not be formed on a sidewall of the preliminary first contact hole 150.

Sidewalls of the first contact pattern 128 and the second impurity region 108 may be exposed by the preliminary first contact hole 150.

Figure 27:
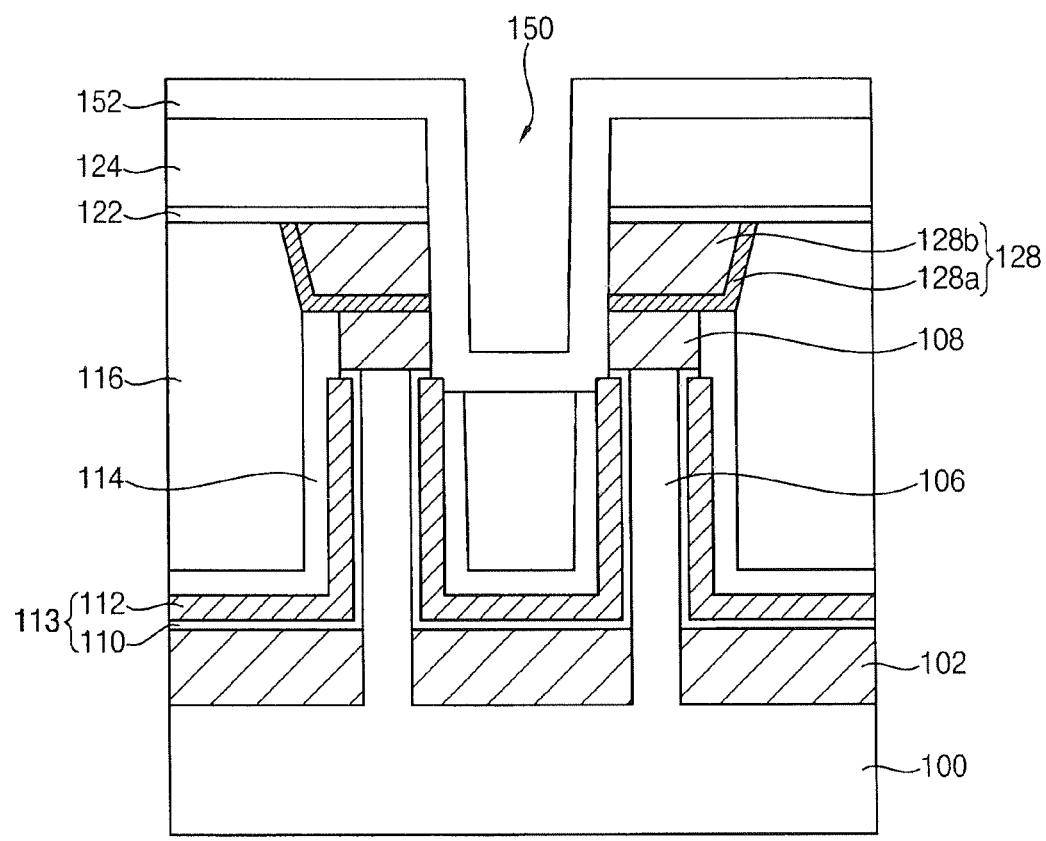

Referring to FIG. 27, the spacer layer 152 may be formed on the sidewall and the bottom of the preliminary first contact hole 150 and the upper surface of the second insulating interlayer 124. The spacer layer 152 may include, e.g., silicon nitride. In example embodiments, the spacer layer 152 may be formed to have a thickness greater than a thickness of the capping layer 114.

Figure 28:
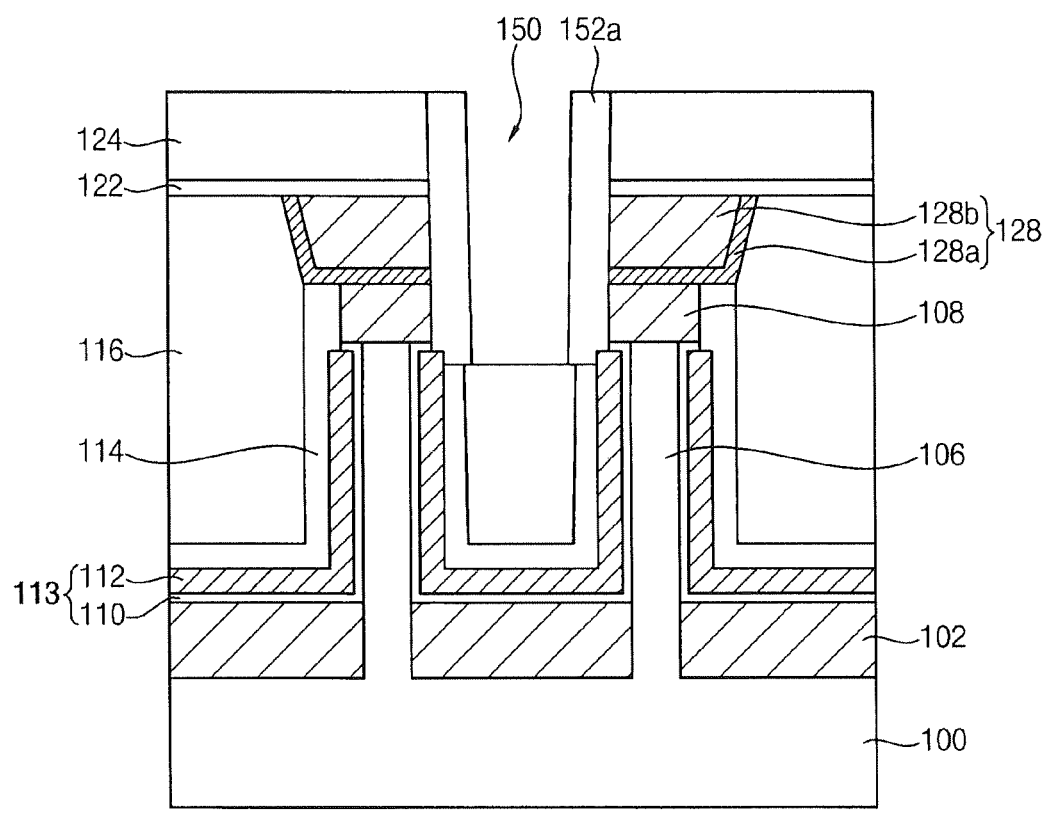

Referring to FIG. 28, the spacer layer 152 may be anisotropically etched to form a preliminary spacer 152a on the sidewall of the preliminary first contact hole 150. The preliminary spacer 152a may be connected to the capping layer 114. In example embodiments, the preliminary spacer 152a may have a thickness greater than a thickness of the capping layer 114. The preliminary spacer 152a may be formed to cover sidewalls of the first contact pattern 128 and the second impurity region 108.

Figure 29:
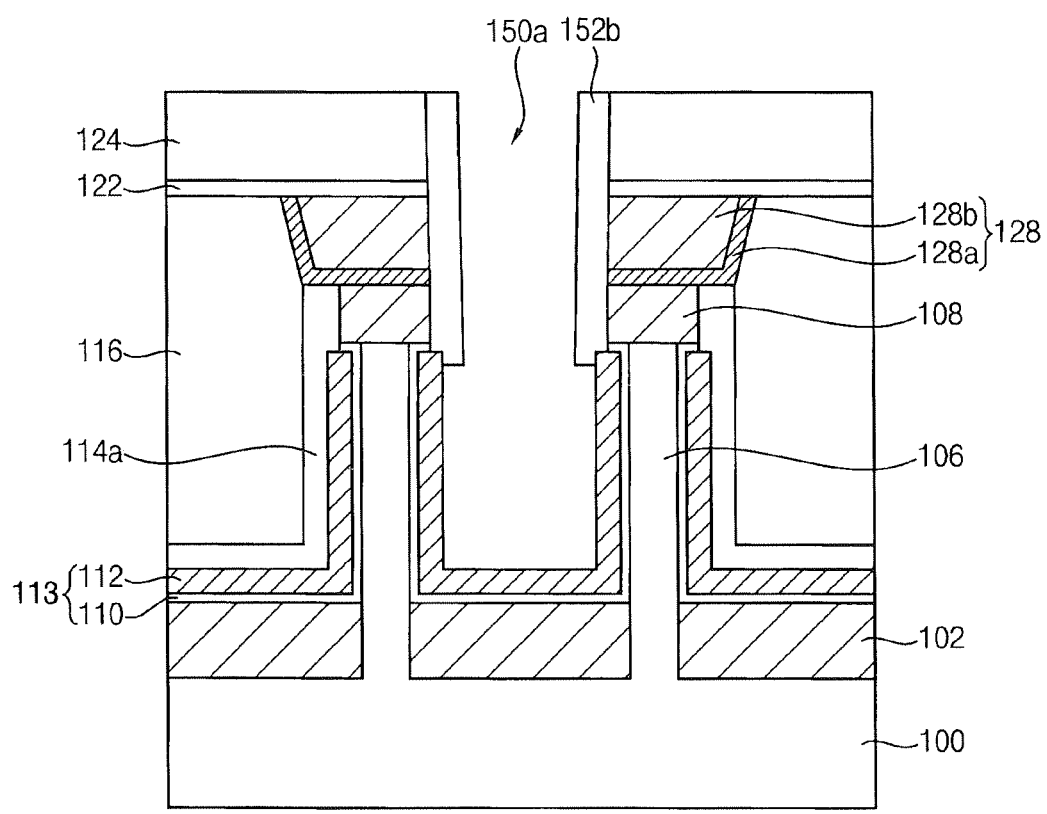

Referring to FIG. 29, the first insulating interlayer 116 on a lower portion of the preliminary first contact hole 150 between the channel patterns 106 may be removed. Also, an exposed capping layer 114 on the gate electrode 112 may be removed to form a contact hole 150a.

That is, a surface of the gate electrode 112 may be exposed by a sidewall and a bottom of the contact hole 150a. Also, the capping layer 114 may be partially removed to form a capping pattern 114a.

During partially removing the capping layer 114, the preliminary spacer 152a may be partially removed to faun a spacer 152b on an upper sidewall of the contact hole 150a. As the preliminary spacer 152a may have the thickness greater than the thickness of the capping layer 114, the spacer 152b formed by partially etching of the preliminary spacer 152a may cover the sidewalls of the first contact pattern 128 and the second impurity region 108. In some example embodiments, during partially removing the capping layer 114, the preliminary spacer 152a may not be removed.

Referring to FIG. 30, a conductive layer may be formed on the second insulating interlayer 124 to fill the contact hole 150a. The conductive layer may be planarized until an upper surface of the second insulating interlayer 124 may be exposed to form preliminary second contact pattern 154. The preliminary second contact pattern 154 may include the preliminary second barrier pattern 154a and the preliminary second metal pattern 154b.

In some example embodiments, a subsequent planarization process may not be performed, so that the preliminary second contact pattern may serve as a second contact pattern. In this case, the semiconductor device shown in FIG. 30 may be manufactured. That is, an upper surface of the second contact pattern may be higher than an upper surface the first contact pattern 128. The upper surface of the second contact pattern may be substantially coplanar with the upper surface of the second insulating interlayer 124.

Figure 31:
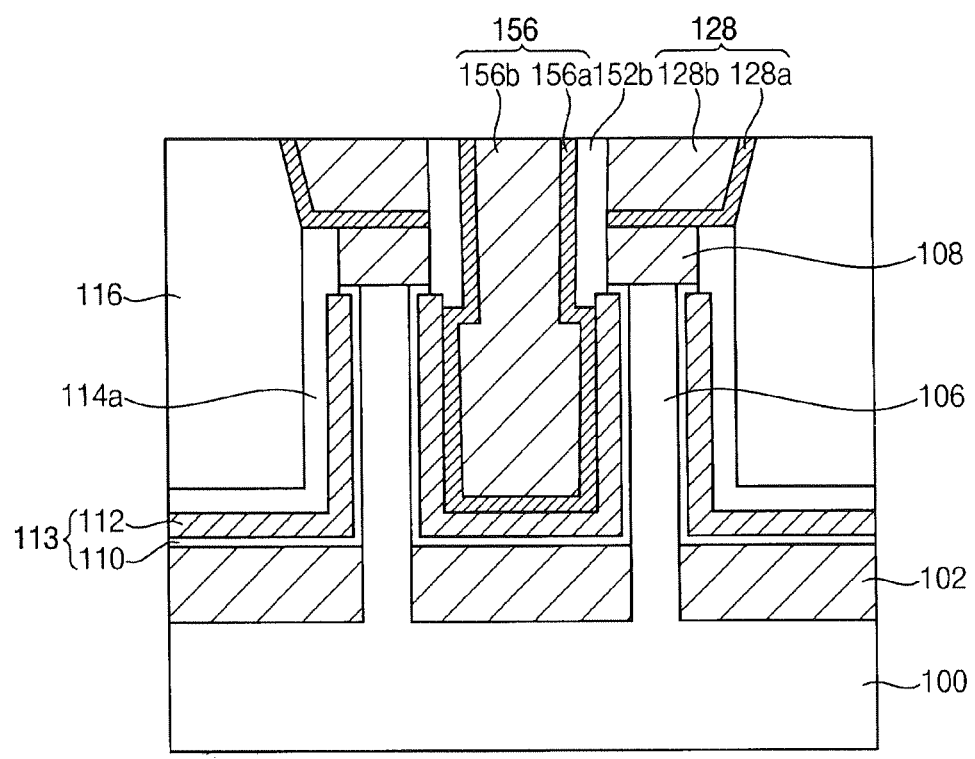

Referring to FIG. 31, the preliminary second contact pattern 154, the second insulating interlayer 124 and the stop layer 122 may be planarized until the upper surface of the first contact pattern 128 may be exposed. Thus, the second insulating interlayer 124 and the stop layer 122 may be removed, and the second contact pattern 156 may be formed. An upper surface of the second contact pattern 156 may be substantially coplanar with the upper surface of the first contact pattern 128 and the first insulating interlayer 116. The second contact pattern 156 may include the second barrier pattern 156a and the second metal pattern 156b.

Figure 32:
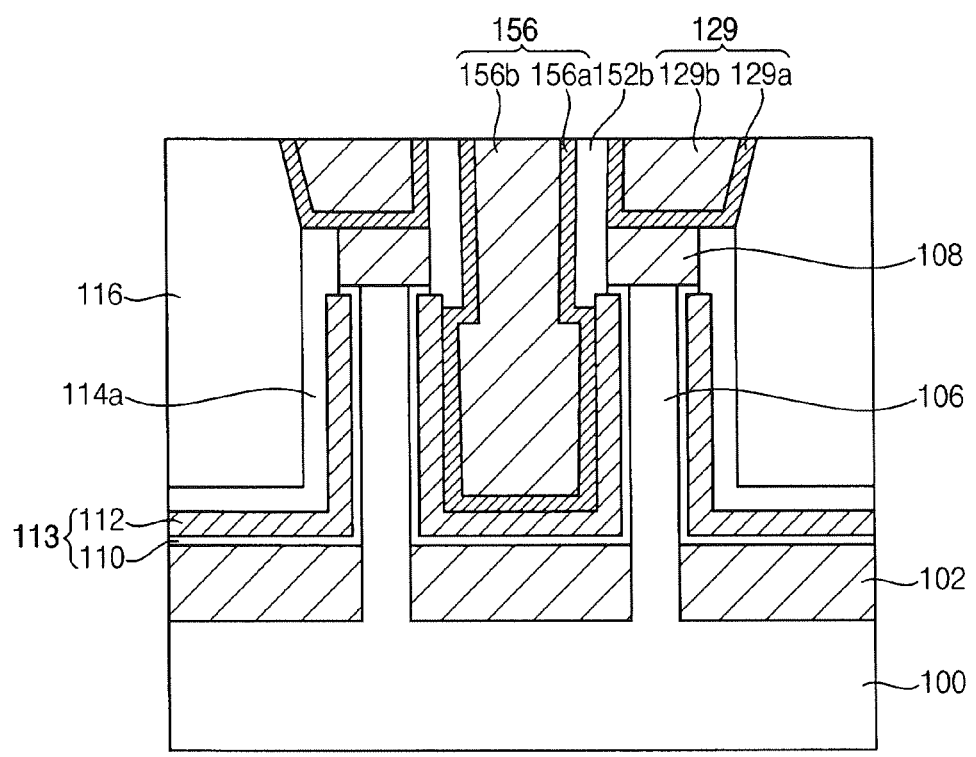
FIG. 32 is a cross-sectional view illustrating a semiconductor device hi accordance with example embodiments.

FIG. 32 is a cross-sectional view illustrating a semiconductor device in accordance with example embodiments.

This semiconductor device may be substantially the same as or similar to that of FIG. 25, except for a shape of the first contact pattern.

Referring to FIG. 32, the first contact pattern 129 may be formed on the second impurity region 108 through an upper portion of the first insulating interlayer 116.

In example embodiments, the first contact pattern 129 may include the first barrier pattern 129a and the first metal pattern 129b. The first barrier pattern 129a may be conformally formed on the first insulating interlayer 116, the capping pattern 114a, the second impurity region 108 and an outer sidewall of the spacer 152b. That is, the first barrier pattern 129a may be formed on a contact surface between the first contact pattern 129 and the outer sidewall of the spacer 152b. The first metal pattern 129b may be formed on the first barrier pattern 129a.

FIGS. 33 to 36 are cross-sectional views illustrating stages of a method of manufacturing a semiconductor device in accordance with example embodiments. The semiconductor device may be the semiconductor device shown in FIG. 32.

Figure 33:
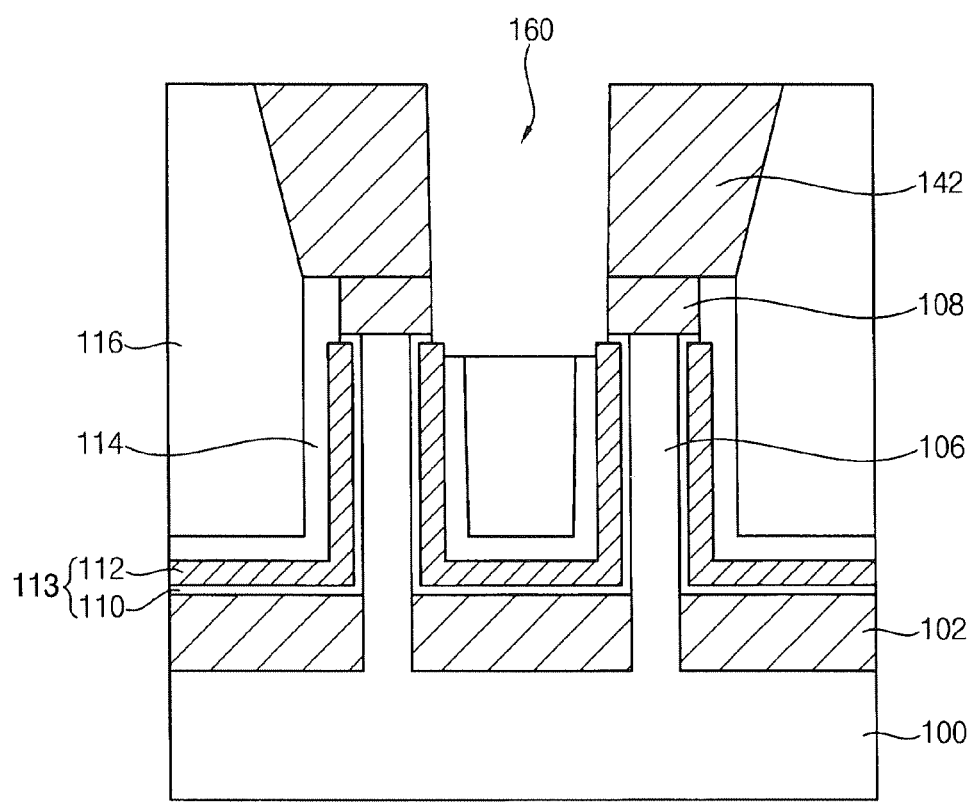
FIGS. 33 to 36 are cross-sectional views illustrating stages of a method of manufacturing a semiconductor device in accordance with example embodiments.

Referring to FIG. 33, processes substantially the same as or similar to those illustrated with reference to FIGS. 7 to 10 may be performed. Then, processes substantially the same as or similar to those illustrated with reference to FIG. 21 may be performed. Thus, the dummy pattern 142 may be formed on the second impurity regions 108 through an upper portion of the first insulating interlayer 116.

An etching mask may be formed on the dummy pattern 142 and the first insulating interlayer 116. The etching mask may include an opening vertically overlapping with a portion between the channel patterns 106. The dummy pattern 142, the first insulating interlayer 116 and the capping layer 114 may be etched using the etching mask to form a preliminary first contact hole 160. A bottom of the preliminary first contact hole 160 may be lower than a lower surface of the second impurity region 108, and may be higher than a surface of the gate electrode 112 between the channel patterns 106. Thus, the first insulating interlayer 116 may remain between the channel patterns 106.

Figure 34:
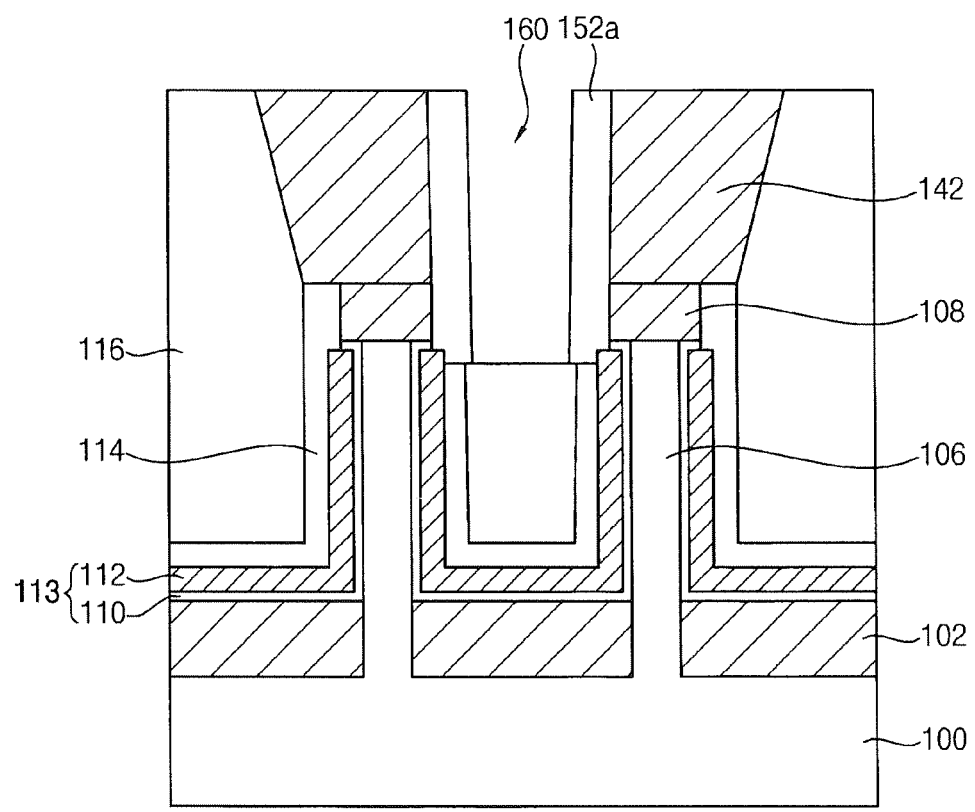

Referring to FIG. 34, the spacer layer may be formed on a sidewall and a bottom of the preliminary first contact hole 160 and surfaces of the first insulating interlayer 116 and the dummy pattern 142. The spacer layer may be anisotropically etched to form a preliminary spacer 152a on the sidewall of the preliminary first contact hole 160. In example embodiments, the preliminary spacer 152a may have a thickness greater than a thickness of the capping layer 114. The preliminary spacer 152a may be formed to cover sidewalls of the dummy pattern 142 and the second impurity region 108.

Figure 35:
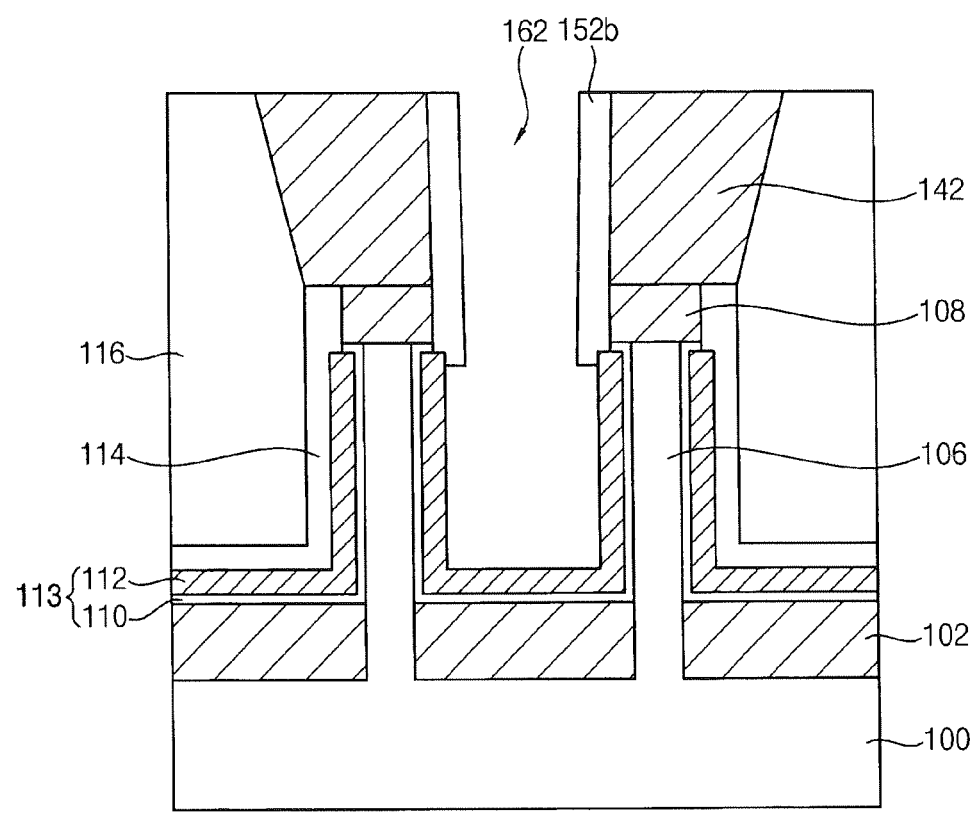

Referring to FIG. 35, the first insulating interlayer 116 on a lower portion of the preliminary first contact hole 160 between the channel patterns 106 may be removed. Also, an exposed capping layer 114 on the gate electrode 112 may be removed to form a contact hole 162.

That is, a surface of the gate electrode 112 may be exposed by a sidewall and a bottom of the contact hole 162. Also, the capping layer 114 may be partially removed to form a capping pattern 114a. During partially removing the capping layer 114, the preliminary spacer 152a may be partially removed to form a spacer 152b on an upper sidewall of the contact hole 162. The spacer 152b may cover the sidewalls of the dummy pattern 142 and the second impurity region 108.

Figure 36:
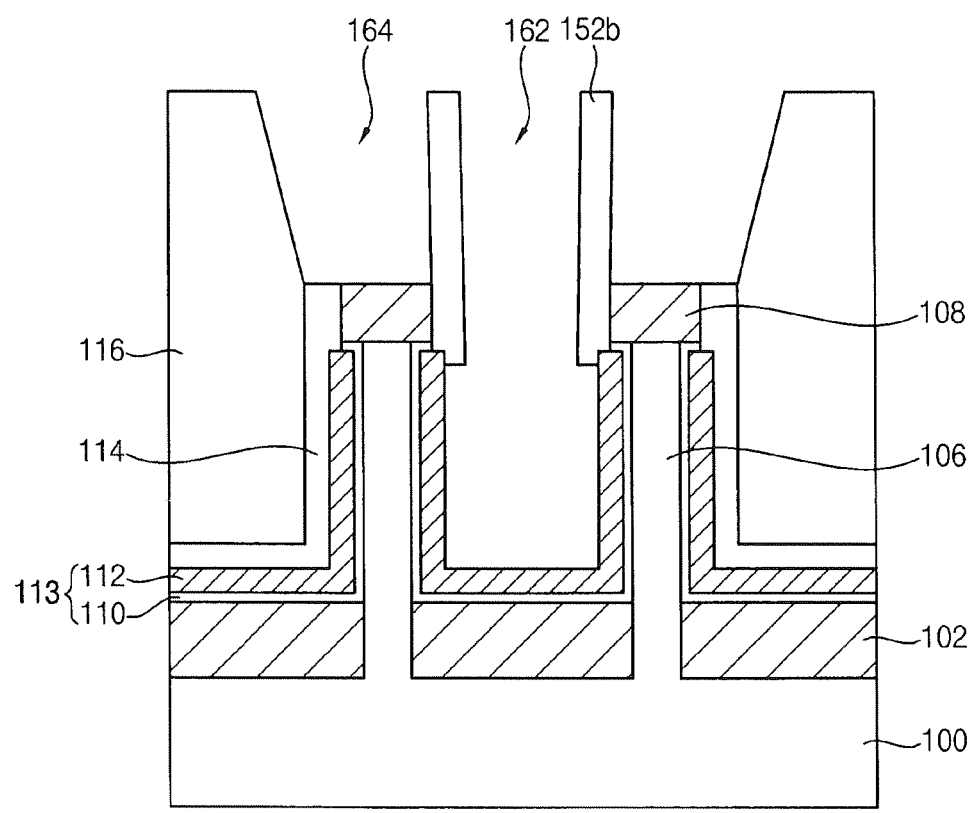

Referring to FIG. 36, the dummy pattern 142 may be removed to form an opening 164.

Thus, the opening 164 and the contact hole 162 may be formed through the first insulating interlayer 116. The opening 164 and the contact hole 162 may be separated from each other by the spacers 152b.

Referring, to FIG. 32 again, the conductive layer may be formed on the first insulating interlayer 116 to fill the opening 164 and the contact hole 162. The conductive layer may be planarized until the upper surface of the first insulating interlayer 116 may be exposed to form the first contact pattern 129 in the opening 164 and the second contact pattern 156 in the contact hole 162. In example embodiments, the first contact pattern 129 may include the first barrier pattern 129a and the first metal pattern 129b. The second contact pattern 156 may include the second barrier pattern 156a and the second metal pattern 156b. The first barrier pattern 129a may be positioned on a contact surface between the first contact pattern 129 and the outer sidewall of the spacer 152b.

Figure 37:
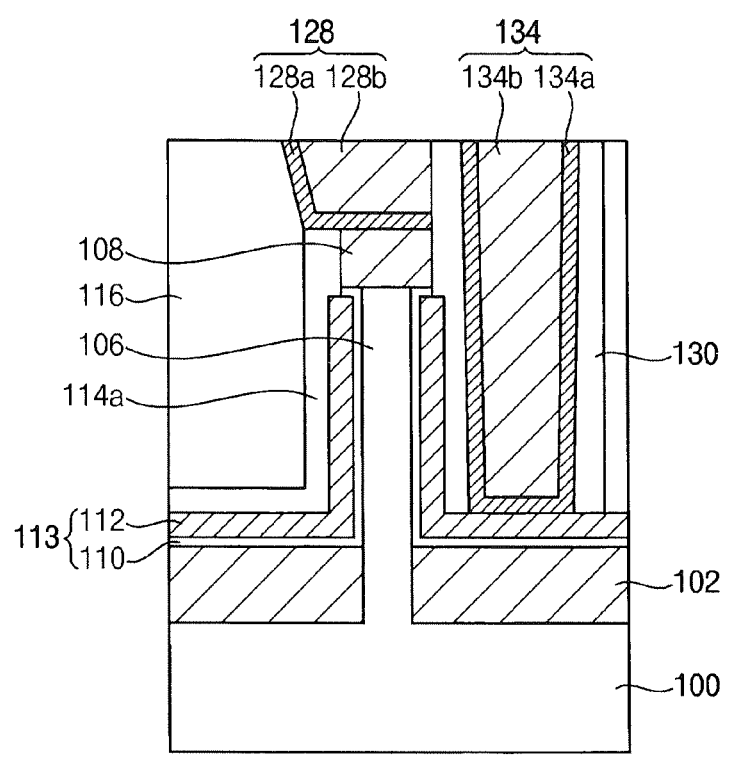
FIGS. 37 and 38 are a cross-sectional view and a plan view illustrating a semiconductor device in accordance with example embodiments.
Figure 38:
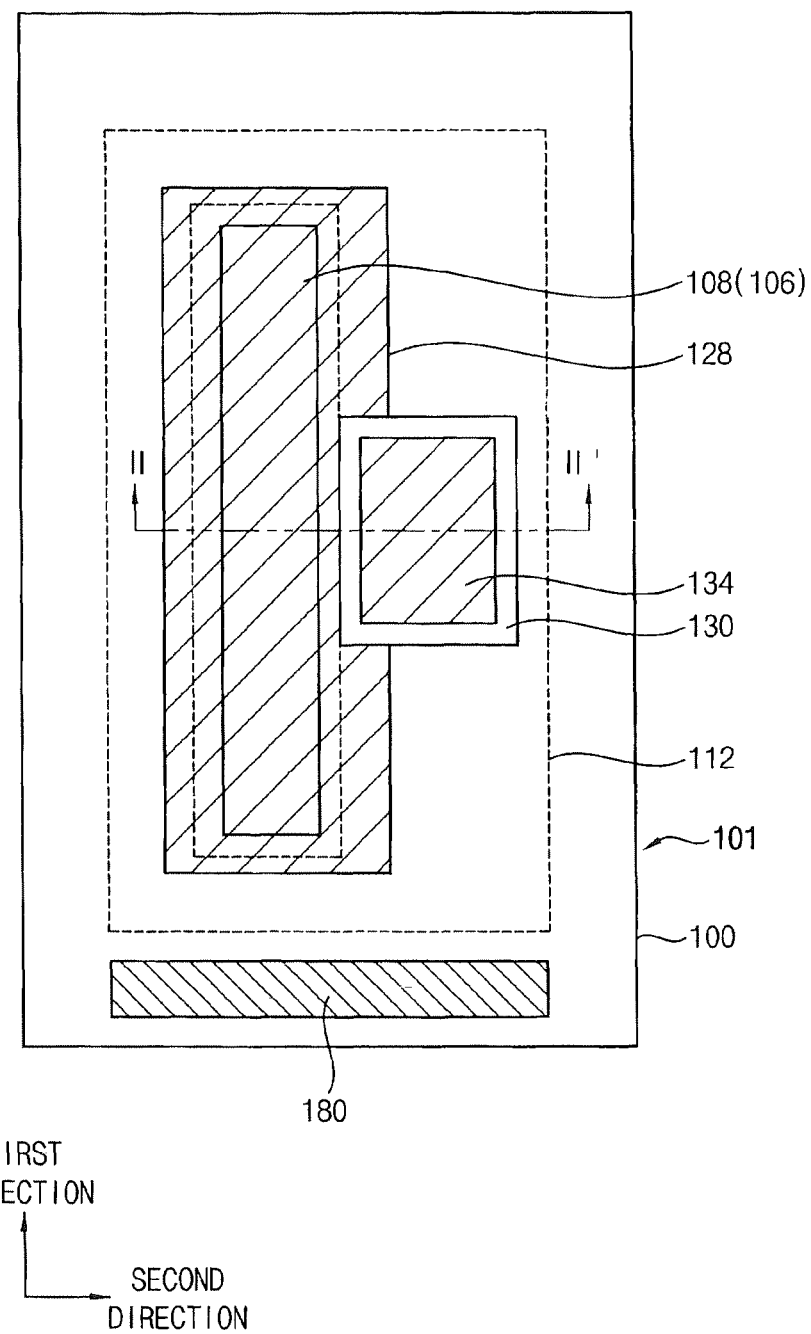

FIGS. 37 and 38 are a cross-sectional view and a plan view illustrating a semiconductor device in accordance with example embodiments.

This semiconductor device may be substantially the same as or similar to that of FIGS. 1 to 3, except for the channel pattern and the first contact pattern. The semiconductor device may include a transistor including one channel pattern.

Referring to FIGS. 37 and 38, the semiconductor device may be formed on a substrate 100. The semiconductor device may include the first impurity region 102, the channel pattern 106, the second impurity region 108 on an upper portion of the channel pattern 106, and gate structure 113. The gate structure 113 may be formed on a sidewall of the channel pattern 106 and the substrate 100 adjacent to the channel pattern 106, and may include the gate insulation pattern 110 and the gate electrode 112. The semiconductor device may include the first contact pattern 128 contacting the second impurity region 108, the second contact pattern 134 contacting the gate electrode 112 and the spacer 130 surrounding the second contact pattern 134. The capping pattern 114a may cover surfaces of the gate structure 113 and the second impurity region 108. The third contact pattern 180 may contact the first impurity region 102.

One channel pattern 106 and one second impurity region 108 may be formed on the active region for forming one transistor. The first contact pattern 128 may be formed on the second impurity region 108. The channel pattern 106 may vertically protrude from the surface of the substrate 100, and may extend in the first direction.

The second contact pattern 134 may contact a surface of the gate electrode 112 formed on the substrate 100 adjacent to channel pattern 106. A portion for forming the second contact pattern 134 may not be limited a position in the first direction.

The spacer 130 may be formed between the first and second contact patterns 128 and 134. Thus, the spacer 130 may contact sidewalls of the first and second contact patterns 128 and 134.

An inner sidewall of the spacer 130 may contact the second contact pattern 134, and an outer sidewall of the spacer 130 may contact sidewalls of the first contact pattern 128 and the second impurity region 108, and a surface of the gate electrode 112 formed on a sidewall of the channel pattern 106.

In example embodiments, the second contact pattern 134 may extend through the first contact pattern 128. Particularly, a part of the second contact pattern 134 may extend through an edge portion of the first contact pattern 128.

In example embodiments, the second contact pattern 134 may be adjacent to the first contact pattern 128 with the spacer 130 disposed therebetween.

Even though not shown, one of the semiconductor devices shown in FIGS. 20, 25 and 32 may include the transistor including one channel pattern. In this case, the second contact pattern may contact a surface of the gate electrode formed on the substrate adjacent to the channel pattern, as the same as or similar to those illustrated with reference to FIGS. 37 to 38.

The semiconductor device in accordance with example embodiments may be applied to logic devices or memory device including transistors.

While example embodiments have been particularly shown and described, it will be understood by one of ordinary skill in the art that variations in form and detail may be made therein without departing from the spirit and scope of the claims.

What is claimed is:

1. A semiconductor device, comprising:
   a first impurity region on a substrate;
   a plurality of channel patterns protruding from an upper surface of the substrate and extending through the first impurity region, each of the plurality of channel patterns extending in a first direction substantially parallel to the upper surface of the substrate and being arranged in a second direction perpendicular to the first direction;
   a second impurity region covering an entire upper surface of each of the channel patterns;
   a gate structure on sidewalls of the channel patterns and the substrate adjacent to the channel patterns, the gate structure comprising a gate insulation pattern and a gate electrode;
   a first contact pattern contacting entire upper surfaces of the second impurity regions and extending in the second direction between adjacent ones of the second impurity regions;
   a second contact pattern contacting a surface of the gate electrode; and
   a spacer between the first and second contact patterns and between a sidewall of the second contact pattern and a portion of the gate structure on the sidewalls of the channel patterns,
   wherein the spacer completely surrounds an entire sidewall of the second contact pattern, the first contact pattern completely surrounds the second contact pattern in plan view, and the spacer contacts the portion of the gate structure on the sidewalls of the channel patterns and contacts a sidewall of each of the first and second contact patterns.

2. The semiconductor device of claim 1, wherein the spacer covers the sidewall of the first contact pattern and a sidewall of the second impurity region.

3. The semiconductor device of claim 1, wherein a lower surface of the second contact pattern contacts an upper surface of the gate electrode formed on the substrate adjacent to the channel pattern.

4. A semiconductor device, comprising:
   a first impurity region on a substrate;
   a plurality of channel patterns protruding from an upper surface of the substrate, each of the channel patterns extending in a first direction substantially parallel to an upper surface of the substrate and being arranged in a second direction perpendicular to the first direction;
   second impurity regions covering an entire upper surface of each of the plurality of channel patterns;

a gate structure on sidewalls of the channel patterns and the substrate between the channel patterns, the gate structure comprising a gate insulation pattern and a gate electrode;

a first contact pattern contacting entire upper surfaces of the second impurity regions and extending in the second direction between adjacent ones of the second impurity regions;

a second contact pattern contacting a surface of the gate electrode; and a spacer between the first and second contact patterns and between a sidewall of the second contact pattern and a portion of the gate structure on the sidewalls of the channel patterns, wherein the spacer completely surrounds an entire sidewall of the second contact pattern, the first contact pattern completely surrounds the second contact pattern in plan view, the spacer contacts the portion of the gate structure on the sidewalls of the channel patterns and contacts a sidewall of each of the first and second contact patterns, and the first and second contact patterns are electrically isolated by the spacer, and wherein the second contact pattern extends through a portion of the first contact pattern.

5. The semiconductor device of claim 4, wherein spacer contacts a sidewall of each of the first and second contact patterns.

6. The semiconductor device of claim 4, wherein the spacer covers a sidewall of the first contact pattern and a sidewall of a second impurity region on a channel pattern.

7. The semiconductor device of claim 4, wherein a lower surface of the second contact pattern contacts an upper surface of the gate electrode formed on the substrate between the channel patterns.

8. The semiconductor device of claim 4, wherein the first contact pattern comprises a first barrier pattern and a first metal pattern, and the second contact pattern comprises a second barrier pattern and a second metal pattern.

9. The semiconductor device of claim 8, wherein an outer sidewall of the spacer contacts the first metal pattern.

10. The semiconductor device of claim 8, wherein an outer sidewall of the spacer contacts the first barrier pattern.

11. The semiconductor device of claim 4, wherein the second contact pattern extends through at least a part of the first contact pattern.

12. A semiconductor device, comprising:

a first impurity region on a substrate;

a plurality of channel patterns protruding from an upper surface of the substrate, each of the channel patterns extending in a first direction substantially parallel to an upper surface of the substrate;

second impurity regions covering an entire upper surface of respective ones of the plurality of channel patterns;

a gate structure on a sidewall of each of the channel patterns and the substrate between the channel patterns, the gate structure comprising a gate insulation pattern and a gate electrode;

a first contact pattern contacting entire upper surfaces of the second impurity regions, the first contact pattern covering upper surfaces of the second impurity regions and extending between adjacent ones of the second impurity regions;

a second contact pattern contacting a surface of the gate electrode; and a spacer completely surrounding an entire sidewall of the second contact pattern, wherein the first contact pattern completely surrounds the second contact pattern in plan view, the spacer covers a sidewall of the first contact pattern and a sidewall of each of the second impurity regions, the spacer contacts a portion of the gate structure on the sidewalls of the channel patterns and contacts a sidewall of each of the first and second contact patterns, and wherein the second contact pattern extends through a portion of the first contact pattern.

13. The semiconductor device of claim 12, wherein an upper surface of the spacer is coplanar with an upper surface of the second contact pattern.

* * * * *